United States Patent [19]

Murakami et al.

[11] Patent Number: 5,572,255
[45] Date of Patent: Nov. 5, 1996

[54] IMAGE READING APPARATUS AND METHOD FOR DRIVING APPROPRIATE PHOTOELECTRIC ENERGY CONVERTING ELEMENTS WHEN FIRST AND SECOND DRIVING VOLTAGES ARE APPLIED SIMULTANEOUSLY

[75] Inventors: Satoru Murakami, Moriyama; Hiromi Maeda, Uji; Yoichi Hosokawa, Akashi, all of Japan

[73] Assignee: Kanegafuchi Kagaku Kogyo Kabushiki Kaisha, Osaka, Japan

[21] Appl. No.: 225,063

[22] Filed: Apr. 8, 1994

[30] Foreign Application Priority Data

Apr. 9, 1993 [JP] Japan .................................. 5-107505
Sep. 20, 1993 [JP] Japan .................................. 5-257792

[51] Int. Cl.$^6$ ............................................. H04N 5/335
[52] U.S. Cl. ........................ 348/294; 348/302; 250/208.1
[58] Field of Search ............................ 348/207, 294, 348/302, 303, 304, 311; 250/208.1; 358/513, 409, 443; H04N 5/335

[56] References Cited

U.S. PATENT DOCUMENTS

| | | | |
|---|---|---|---|
| 4,347,533 | 8/1982 | Ogawa | 358/296 |
| 4,565,928 | 1/1986 | Yamamoto et al. | 250/578 |
| 4,604,527 | 8/1986 | Chenevas-Paule et al. | 250/578 |
| 4,714,836 | 12/1987 | Kitamura et al. | 250/578 |
| 5,004,903 | 4/1991 | Kitamura et al. | 250/208.1 |
| 5,027,226 | 6/1991 | Nagata et al. | 358/482 |
| 5,235,174 | 8/1993 | Ikeda et al. | 250/208.1 |
| 5,283,669 | 2/1994 | Sakai et al. | 348/294 |
| 5,335,092 | 8/1994 | Kitamura et al. | 348/294 |

FOREIGN PATENT DOCUMENTS 112202 6/1984 European Pat. Off. .

Primary Examiner—Joseph Mancuso
Assistant Examiner—Tuan V. Ho
Attorney, Agent, or Firm—Armstrong, Westerman, Hattori, McLeland & Naughton

[57] ABSTRACT

An image reading apparatus and method in which a plurality of photoelectric energy converting elements disposed in a one-dimensional array is divided every m elements into n first blocks $B_1, B_2, \ldots, B_n$, driving voltages are applied sequentially to the units of m photoelectric energy converting elements in the first blocks $B_1, B_2, \ldots, B_n$, and the electrical signals of the photoelectric energy converting elements are read out. The drive side on which the driving voltage is sequentially applied to the above-mentioned divided n first blocks, $B_1, B_2, \ldots, B_n$ is further divided every x first blocks into y second blocks $C_1, C_2, \ldots, C_y$, and are provided a first voltage application means which applies a first driving voltage (D1, D2, ..., Dy) in sequence to the units of x first blocks $B_1, B_2, \ldots, B_x$ in the second blocks $C_1, C_2, \ldots, C_y$, a second voltage application means which applies a second driving voltage (E1, E2, ..., Ex) in sequence to the first blocks $B_1, B_2, \ldots, B_x$ in the same relative positions in the respective second blocks $C_1, C_2, \ldots, C_y$ and a matrix driver which applies the driving voltage to drive the units of m photoelectric energy converting elements 10, 12 in the appropriate first blocks when the above-mentioned first driving voltage and second driving voltage are applied simultaneously to the first blocks $B_1, B_2, \ldots, B_n$.

11 Claims, 18 Drawing Sheets $$\frac{Re}{Re + Rd} \cdot 5 = 2.5 \quad (Re = Rd)$$

$$\frac{Rd}{Re + Rd} \cdot 5 = 2.5 \quad (Re = Rd)$$

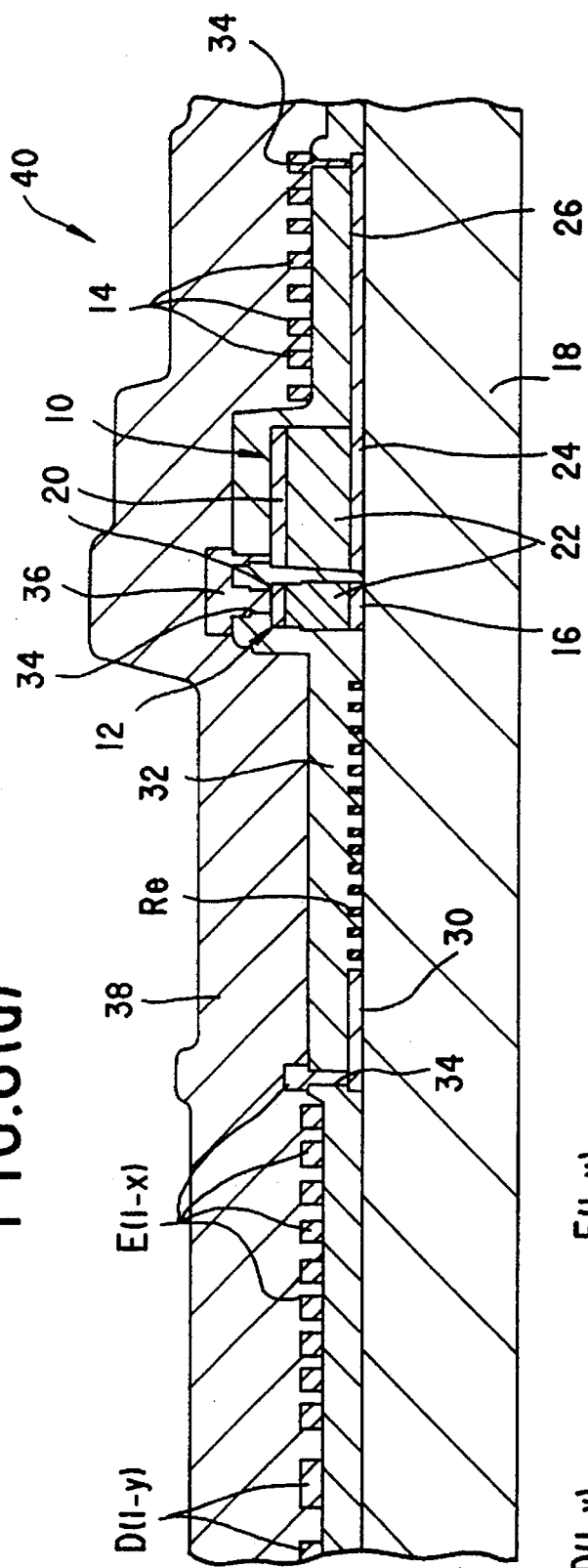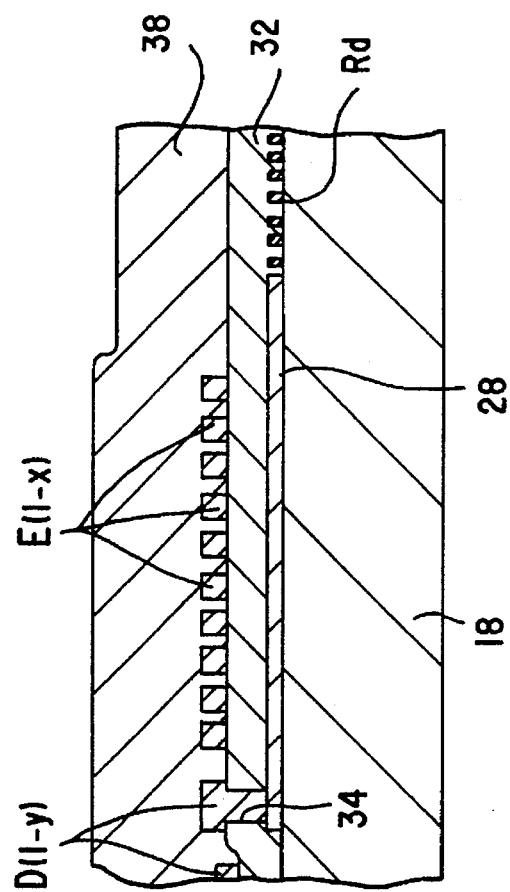

| E (V) | D (V) | VF ≈ 0V Vd (V) | VF = 1V Vd (V) |
|---|---|---|---|
| 0 | 0 | 0 | ~0.5 |
| 0 | 5 | 0 | 1 |
| 5 | 0 | 0 | 1 |
| 5 | 5 | 5 | 5 |

IMAGE READING APPARATUS AND METHOD FOR DRIVING APPROPRIATE PHOTOELECTRIC ENERGY CONVERTING ELEMENTS WHEN FIRST AND SECOND DRIVING VOLTAGES ARE APPLIED SIMULTANEOUSLY

BACKGROUND OF THE INVENTION

1. Field of the Invention

The present invention relates to an image reading apparatus and method and, more particularly, to an apparatus and method for reading the image of a document in a time-series in a facsimile device, image scanner, digital copier, electronic blackboard, and the like.

2. Description of the Related Art

In recent years, image reading devices commonly known as contact-type image sensors have generally been utilized in document readers such as facsimile devices, instead of the charge coupled device (CCD)-type image reader for which reducing optics are necessary. Since this image reading device is formed as a one-dimensional plurality of photoelectric energy converting elements made of a thin film semiconductor, such as amorphous silicon on a glass substrate, the image of a document can be read uniformly. A normal photodiode is used in the photoelectric energy converting element, but because of the extremely weak photocurrent generated in the photodiode, a charge storage method is widely employed in which this photocurrent is detected from the charge temporarily accumulated in the junction capacitance of the photodiode. Moreover, as a result of the number of photoelectric energy converting elements becoming extremely large, a matrix driver, which may have a smaller number of switching elements, is usually employed.

For example, as shown in FIG. 1, a prior art image reading device is constructed by fabricating a one-dimensional array of m by n photoelectric energy converting elements each comprising a photodiode 1 and a blocking diode 2 connected to this photodiode 1 in series and with opposite polarity. These formed pairs of photodiodes 1 and blocking diodes 2 are divided every m diode pairs into n blocks, $B_1, B_2, \ldots, B_n$. The anode terminals of the blocking diodes 2 in each block $B_1, B_2, \ldots, B_n$ are connected commonly via a respective buffer gate 3 to the respective output terminal of a shift register 4. The anode terminals of the photodiodes 1 in the same relative positions in the respective blocks $B_1, B_2, \ldots, B_n$ are connected together commonly via a respective current amplification circuit $IV_1, IV_2, \ldots, IV_m$ to a respective integration circuit $IN_1, IN_2, \ldots, IN_m$. Moreover, the integration circuits $IN_1, IN_2, \ldots, IN_m$ are connected to sample holding circuits $SH_1, SH_2, \ldots, SH_m$, a multiplexer circuit MPX and an amplification circuit 5, so that a signal processing circuit for time-integrating the electric currents $I_1, I_2, \ldots, I_m$ flowing out from the photodiodes 1 is constructed by the current amplification circuits $IV_1, IV_2, \ldots, IV_m$, integration circuits $IN_1, IN_2, \ldots, IN_m$, sample holding circuits $SH_1, SH_2, \ldots, SH_m$, multiplexer circuit MPX and amplification circuit 5.

According to this image reading device, as shown in the timing diagram of FIG. 2, a data input pulse Din which is input into the shift register 4 is shifted in sequence within the shift register 4 in accordance with a clock pulse CLK, and is output in sequence from the respective output terminal. Thus, a driving voltage is applied to the photodiodes 1 in the block units $B_1, B_2, \ldots, B_n$ from one block to the next. In the photodiodes 1 to which the driving voltage is applied, a current $I_1, I_2, \ldots, I_m$ flows in proportion to the photo signal stored in the junction capacitance, and this is amplified by the respective current amplified circuit $IV_1, IV_2, \ldots, IV_m$. Further, by using the signal processing circuit formed by the integration circuit $IN_1, IN_2, \ldots, IN_m$, sample holding circuit $SH_1, SH_2, \ldots, SH_m$, multiplexer circuit MPX and amplification circuit 5, the current $I_1, I_2, \ldots, I_m$ flowing out from the photodiode 1 is signal processed, to give an output voltage Vout. Thus, the electrical signals of the respective photodiodes 1 are scanned in the block units $B_1, B_2, \ldots, B_n$ from one block to the next by using the shift register 4 and so forth, and the channel parts within one block are read out simultaneously.

As explained above, the shift register output, as shown in the timing diagram of FIG. 2, serves as the driving voltage Vd of the matrix driver using the charge storage method. As a result, for example, since there are 1728 elements in an 8 element/mm image reading device of A4 size, either 32 channels by 54 blocks, 16 channels by 108 blocks or 8 channels by 216 blocks are constructed, of which the construction is usually 16 channels by 108 blocks. However, there is a problem in that a large number of shift registers is necessary in each of these constructions. Furthermore, since in the case of forming an IC, analog circuit components are expensive, it is necessary to use many digital circuits in the construction.

SUMMARY OF THE INVENTION

The present invention has been realized in consideration of these kinds of problems inherent in the prior art, and accordingly, an object of this invention is to provide an efficient, inexpensive image reading apparatus and method having a greatly reduced number of drive gates.

In accomplishing the foregoing and related objects, the present invention provides an image reading method in which a driving voltage is sequentially applied to a plurality of photoelectric energy converting elements disposed in a one-dimensional array, and the electrical signals of said photoelectric energy converting elements are then read, wherein the drive side on which the driving voltage is applied to said photoelectric energy converting elements is divided every x elements into y blocks, a first driving voltage is applied sequentially to the units of x photoelectric energy converting elements in said blocks, a second driving voltage is applied sequentially to the photoelectric energy converting elements in the same relative positions in the respective blocks, and the appropriate photoelectric energy converting elements can be driven when said first driving voltage and said second driving voltage are applied simultaneously.

Furthermore, the present invention provides an image reading method in which a plurality of photoelectric energy converting elements disposed in a one-dimensional array is divided every m elements into n first blocks, a driving voltage is applied sequentially to the units of m photoelectric energy converting elements in the first blocks and the electrical signals of said photoelectric energy converting elements are read, wherein the drive side on which the driving voltage is sequentially applied to the above-mentioned divided n first blocks is further divided every x first blocks into y second blocks, a first driving voltage is sequentially applied to the units of x first blocks in said second blocks, a second driving voltage is sequentially applied to the units of first blocks in the same relative positions in the respective second blocks, and the appropriate units of m photoelectric energy converting elements in the first blocks are driven when the first driving voltage and the second driving voltage are applied simultaneously to the first blocks.

The present invention also provides an image reading device in which a driving voltage is sequentially applied to a plurality of photoelectric energy converting elements disposed in a one-dimensional array and the electrical signals of said photoelectric energy converting elements are read, wherein the drive side on which the driving voltage is applied to the above-mentioned photoelectric energy converting elements is divided every x elements into y blocks, and includes:

(a) a first voltage application means for applying a first driving voltage in sequence to the units of x photoelectric energy converting elements in said blocks, (b) a second voltage application means for applying a second driving voltage in sequence to the photoelectric energy converting elements in the same relative positions in the respective blocks, and (c) a matrix driver for applying the driving voltage to drive the appropriate photoelectric energy converting elements when the first driving voltage and the second driving voltage are applied simultaneously.

Moreover, the present invention provides an image reading device in which a plurality of photoelectric energy converting elements disposed in a one-dimensional array is divided every m elements into n first blocks, a driving voltage is applied sequentially to the units of m photoelectric energy converting elements in said first blocks and the electrical signals of said photoelectric energy converting elements are read, wherein the drive side on which the driving voltage is applied sequentially to the above-mentioned divided n first blocks is further divided every x first blocks into y second blocks, and includes:

(a) a first voltage application means for applying a first driving pulse sequentially to the units of x first blocks in said second blocks, (b) a second voltage application means for applying a second driving voltage sequentially to the first blocks in the same relative positions in the respective second blocks, and (c) a matrix driver for applying the driving voltage to drive the appropriate units of m photoelectric energy converting elements in the first blocks when the first driving voltage and the second driving voltage are applied simultaneously to the first blocks.

The matrix driver of the image reading device of the present invention may be constructed from a circuit for addition comprising resistors, or it may be constructed from AND circuitry.

The circuit for addition comprising resistors may be formed from constructing layers which constitute the photoelectric energy converting elements of the image reading device.

In the image reading method and device thereof of the present invention, because the construction is such that the drive side on which the driving voltage is applied to the photoelectric energy converting elements is divided every x elements or units of elements into y blocks, and such that the first driving voltage and the second driving voltage are shifted in sequence by using the x by y matrix, to drive the photoelectric energy converting elements or the units of set numbers of photoelectric energy converting elements divided into blocks in sequence, it is possible to construct an extremely small number of drive-side gates, so that an inexpensive image reading device can be obtained.

Moreover, since this construction has a reduction in the number of analog parts, it is possible to construct a device which has strong resistance to noise, and since the driving voltage has a high noise margin, the design of the image reading device becomes relatively simple.

Furthermore, while the performance of the drive-side shift register has a large influence on the reading speed of an image reading device, by making a matrix, the reading speed can be improved notwithstanding the performance of the shift register.

Moreover, the image reading device of the present invention can be offered inexpensively since the resistors which constitute the circuit for addition may be fabricated using any of the constructing layers constituting the photoelectric energy converting element, that is to say, the lower electrode, the semiconductor layer, the upper transparent electrode and the coupling electrode, so that the production steps are hardly increased.

BRIEF DESCRIPTION OF THE DRAWINGS

These and other aspects and advantages of the present invention will become better understood with regard to the following description, appended claims and accompanying drawings in which:

FIG. 8(a) is a cross-sectional explanatory drawing of the section 8A—8A of the image reading device shown in FIG. 7.

FIG. 8(b) is a cross-sectional explanatory drawing of the section 8B—8B of the image reading device shown in FIG. 7.

DETAILED DESCRIPTION OF THE PREFERRED EMBODIMENTS

Figure 1:
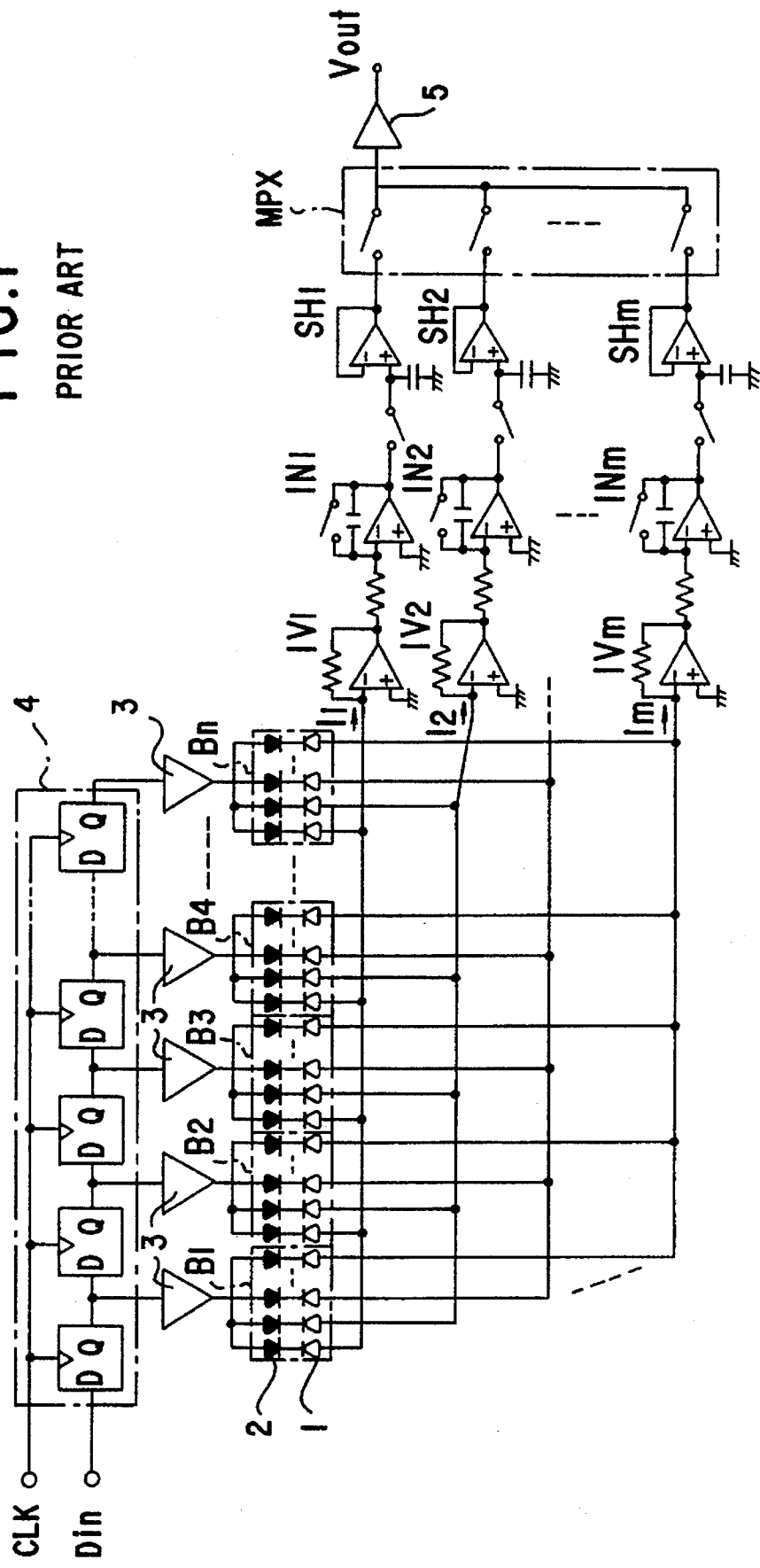
FIG. 1 is a circuit diagram showing an example of a prior art image reading device.
Figure 2:
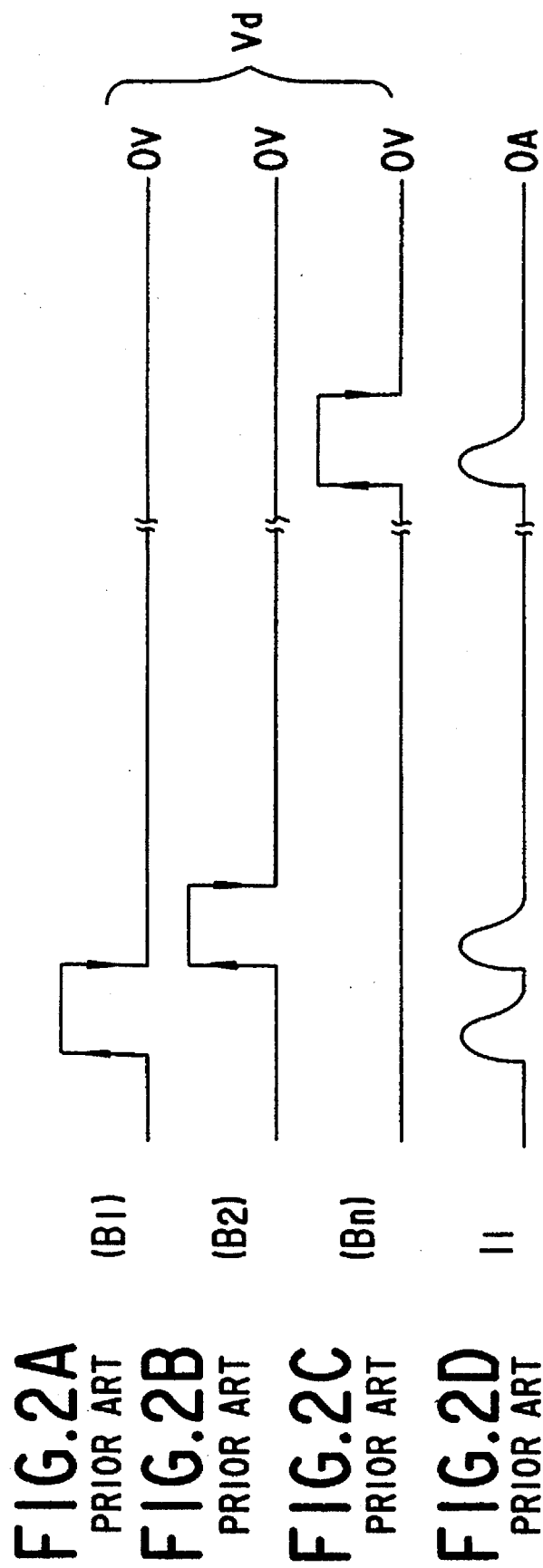
FIG. 2 is a timing diagram for explaining the operation of the prior art example shown in FIG. 1.
Figure 3:
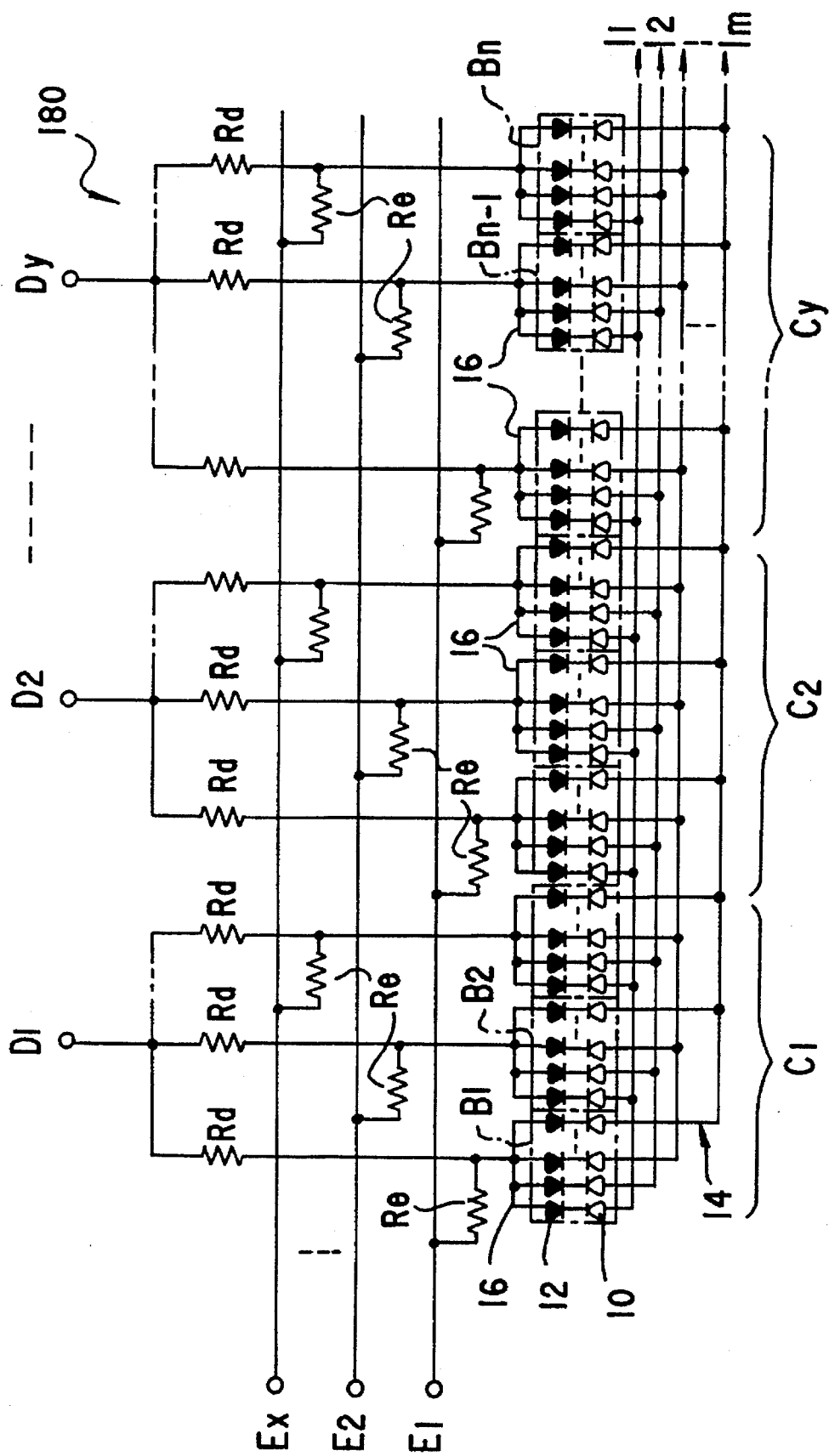
FIG. 3 is a circuit diagram showing an embodiment of the image reading method and device thereof of the present invention.

As shown in FIG. 3, an image reading device 180 of the present invention is a one-dimensional array of m by n photoelectric energy converting elements each comprising a photodiode 10 and a blocking diode 12 connected in series and opposite polarity with this photodiode 10, in which the pairs of a photodiode 10 and a blocking diode 12 are divided into n first blocks $B_1, B_2, \ldots, B_n$ each containing m diode pairs. These photodiodes 10 and blocking diodes 12 are fabricated simultaneously, side by side, as stacked layers of a thin film semiconductor, such as amorphous silicon or the like, in a pin structure or the like, and they may be formed with the same structure or they may be formed with a different structure.

The anode terminals of the photodiodes 10 in the same relative positions in the respective first blocks $B_1, B_2, \ldots, B_n$ are each connected together in a common matrix wiring 14. Here, normal current amplification circuits, integration circuits, sample holding circuits, multiplexer circuits and so forth are connected to the output terminals of the matrix wiring 14, so that the electric currents $I_1, I_2, \ldots, I_m$ flowing from the respective photodiodes 10 are output in a time-integrated manner.

The anode terminals of the blocking diodes 12 in each first block $B_1, B_2, \ldots, B_n$ are connected commonly by common wirings 16, and the first blocks $B_1, B_2, \ldots, B_n$ which are divided into n blocks are further divided every x first blocks into y second blocks $C_1, C_2, \ldots, C_y$. Then, in order that the first driving voltage can be applied in sequence to the respective units of x first blocks $B_1, B_2, \ldots, B_x$ in the respective second blocks $C_1, C_2, \ldots, C_y$, the common wirings 16 of the first blocks $B_1, B_2, \ldots, B_x$ are connected via resistors Rd to respective common input terminals $D_1, D_2, \ldots, D_y$. Moreover, the common wirings 16 of the first blocks $B_1, B_2, \ldots, B_x$ in the same relative positions in the respective second blocks $C_1, C_2, \ldots, C_y$ are connected via resistors Re to respective common input terminals $E_1, E_2, \ldots, E_x$, so that the second driving voltage can be applied to the first blocks $B_1, B_2, \ldots, B_x$ in each of the second blocks $C_1, C_2, \ldots, C_y$ both individually and in sequence.

Figure 4A:
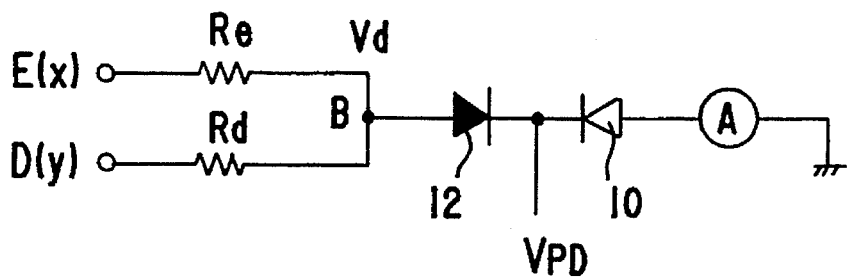
FIG. 4(a) is an explanatory circuit drawing showing the basic construction of the image reading apparatus and method shown in FIG. 3.
Figure 4B:
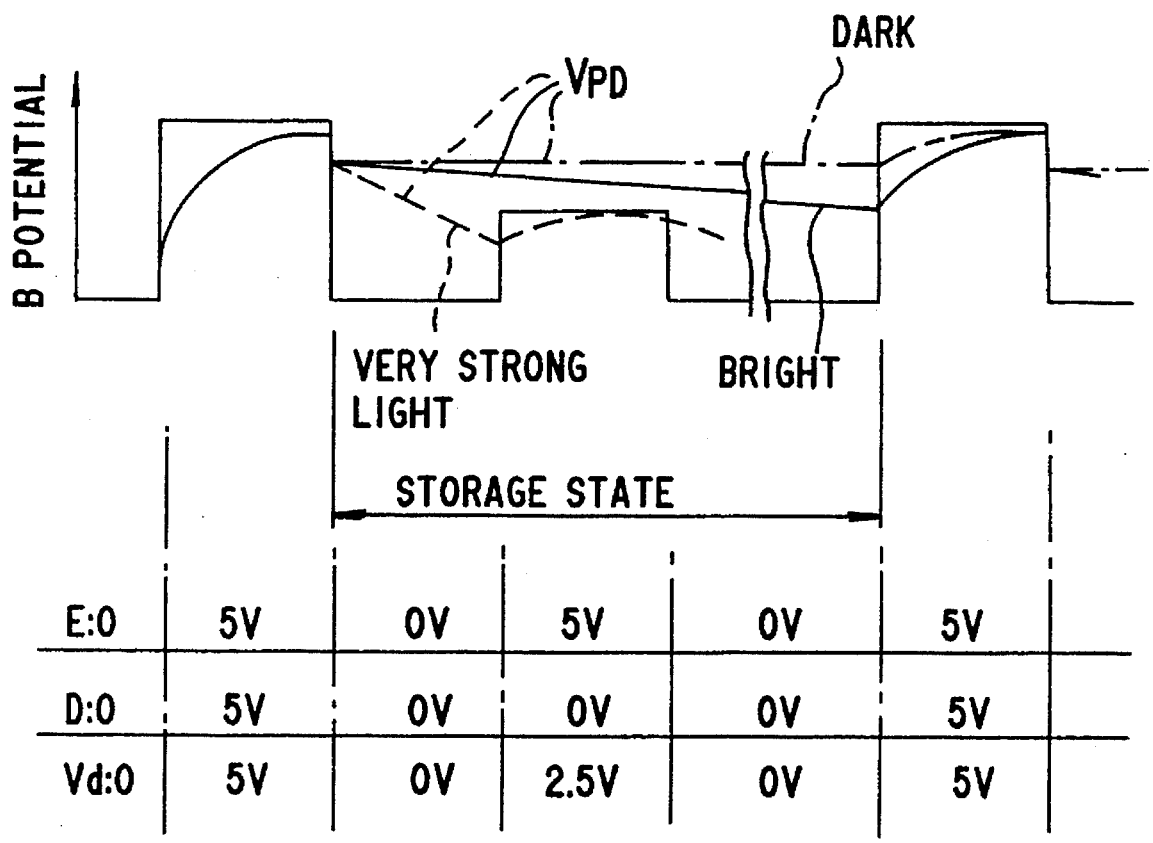
FIG. 4(b) is a drawing explaining the basic operation of the image reading apparatus and method shown in FIG. 3.

Here, as shown in FIG. 4(a), in any first block $B_1, B_2, \ldots, B_n$, any pair of a photodiode 10 and a blocking diode 12 are in opposition, and the resistor Rd and the resistor Re are connected to form a circuit for addition. Accordingly, when, as shown in FIGS. 4(a) and 4(b), a first driving voltage D= 5 V and a second driving voltage E= 5 V are input from the input terminals $D_{(y)}$ and $E_{(x)}$, respectively, the electrical potential Vd at the point B is 5 V, which gives the read-out state. Next, when the first driving voltage D= 0 V and the second driving voltage E=0 V, the potential Vd at the point B is 0 V, and further, when D= 0 V and E= 5 V or when D= 5 V and E= 0 V are input, the potential Vd at the point B is 2.5 V, any of which conditions gives the storage state, in which there is no read-out.

Now, when the electrical potential Vd at the point B is 2.5 V, if the electrical potential $V_{PD}$ between the photodiode 10 and the blocking diode 12 does not fall to 2.5 V or less, no problem whatsoever arises. In the case when the light entering the photodiode 10 is excessively strong, however, an erroneous reading results even when the potential $V_{PD}$ is 2.5 V. However, even in this case, if the storage time is short, that is to say, if the speed is made high, the erroneous reading can be avoided.

These input terminals $D_1, D_2, \ldots, D_y$ and input terminals $E_1, E_2, \ldots, E_x$ are connected to the respective output terminals of a shift register via buffer gates, not shown in the figures, and by these, the first voltage application means and the second voltage application means, respectively, are constructed. Accordingly, the shift register used provides a sum total of (x+y) flip-flop steps, so that it is possible to sharply reduce the number of gates constructed compared to the shift register in the conventional system, which provides n (= x times y) flip-flop steps.

In this kind of embodiment, the number of resistors Rd and Re used corresponds to the number of input terminals $D_1, D_2, \ldots, D_y$ and input terminals $E_1, E_2, \ldots, E_x$, so that there are y times x resistors Rd and x times y resistors Re. For a resistance of Rd= Re= R and a first or second driving voltage of V, the current consumption on the input terminal $D_{(y)}$ side is $V(x/2R)$ and on the input terminal $E_{(x)}$ side is $V(y-1)/2R$. Accordingly, for example, for an 8-channel analog (220 blocks) y= 10, x= 22 matrix, with a resistance of Rd= Re= R= 10 kΩ and a first or second driving voltage of V= 5 V, the current consumption on the input terminal $E_{(x)}$ side is 2.25 mA, and the current consumption on the input terminal $D_{(y)}$ side is 5.5 mA. Therefore, the resistance value of the resistors Rd and Re used are determined from these equations, and preferably have a resistance value from several kΩ to several tens of kΩ.

Figure 5A:
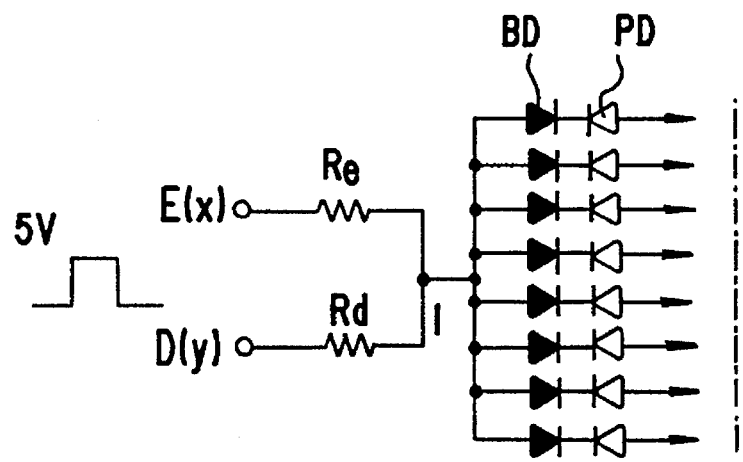
FIG. 5(a) is an explanatory circuit diagram showing the determination of the most suitable resistance value of the circuit for addition resistors which constitute the image reading device of the present invention, being a circuit diagram of a simplified image reading device.

Here, more specifically, the resistance values of the resistors Rd and Re used in the circuit for addition of the image reading device are determined. The case in which a one-block, 8-channel image reading device is driven by a driving voltage of 5 V is explained as an example, as shown in FIG. 5(a). The sizes of the photodiode PD and the blocking diode BD, which constitute the photoelectric energy converting element, were fabricated to be 110 μm square and 33 μm square, respectively. The lower electrode was fabricated from chromium and the upper transparent electrode was fabricated from ITO, and in addition, the semiconductor layer was fabricated by depositing 9000 Å of amorphous silicon as the semiconductor. When the obtained image reading device was driven by a driving voltage of 5 V, the capacitance surge current I flowing in this one block was observed to be about 5.7 μA. Therefore, in the image reading device, it is preferred that the resistance value of the resistors Rd and Re which can eliminate the influence of this capacitance surge current I from the read-out current be established.

Figure 5B:
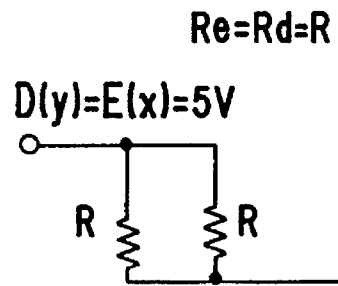
FIG. 5(b) is an explanatory circuit diagram showing the determination of the most suitable resistance value of the circuit for addition resistors which constitute the image reading device of the present invention, being a diagram illustrating the circuit for addition during the driving mode.

When the aforesaid image reading device is in the mode shown in FIG. 5(b), that is to say, when a driving voltage of 5 V is applied to the input terminal $E_{(x)}$ and the input terminal $D_{(y)}$, the image reading device is driven. Furthermore, when in the mode shown in FIG. 5(c), that is to say, when a driving voltage of 5 V is applied to the input terminal $D_{(y)}$ while the input terminal $E_{(x)}$ is 0 V, or when in the mode shown in FIG. 5(d), that is to say, when the input terminal $E_{(x)}$ and the input terminal $D_{(y)}$ are 0 V, the image reading device is not driven. Here, when the image reading device is driven, and with Re= Rd= R as the resistance, the overall resistance value in the circuit for addition becomes R/2. Since, when the overall resistance value (R/2) of the circuit for addition during driving of the image reading device is small, the size of the driving power consumption becomes large, it is preferable that the resistance value is large. However, when the resistance value is very large, the delay time becomes long, so that it is preferable that the overall resistance value (R/2) of the circuit for addition be not more than about 100 KΩ.

Figure 5C:
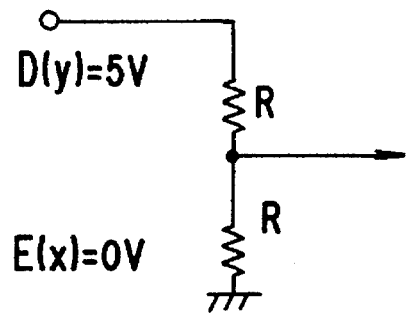
FIG. 5(c) is an explanatory circuit diagram showing the determination of the most suitable resistance value of the circuit for addition resistors which constitute the image reading device of the present invention, being a diagram illustrating the circuit for addition during a non-driving mode.
Figure 5D:
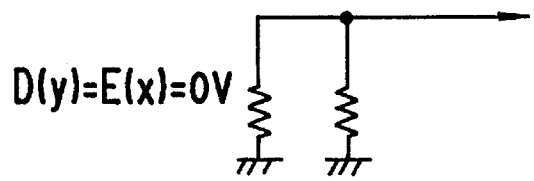
FIG. 5(d) is an explanatory circuit diagram showing the determination of the most suitable resistance value of the circuit for addition resistors which constitute the image reading device of the present invention, being a diagram illustrating the circuit for addition during another non-driving mode.

Furthermore, when the mode shown in FIG. 5(b) changes over to the mode shown in FIG. 5(c), which is the non-driving mode, a capacitance surge current I flows. In order that the image reading device is not driven by this capacitance surge current I at the time of the mode shown in FIG. 5(c), it is necessary to choose a resistor R which has a resistance value which can allow the capacitance surge current I to flow to ground. For reasons of safety, it is preferable that this resistor R is set so that it is possible for a current of not less than several times the capacitance surge current I (about 5.7 μA) to flow. Thus, supposing that a current of 5 times the capacitance surge current I can flow, the resistance value of the resistor R becomes about 88 kΩ, and furthermore, similarly supposing a current of 10 times, the resistance value becomes about 44 kΩ. This resistance value satisfies the aforesaid condition for the resistance of the resistor R during driving of the image reading device since when the resistance of the resistor R becomes about 88 kΩ the overall resistance value during driving is about 44 kΩ, and the capacitance surge current I can flow sufficiently during driving. Furthermore, because the voltage drop is about 0.25 V from this current I (about 5.7 ΩA), a minute amount opposes the 5 V driving voltage, so that no influence on the properties is caused. Accordingly, at the time of the mode shown in FIG. 5(c) in which is assumed the above-mentioned, it is preferred that a resistance value of the resistor R is chosen with which a current not less than 5 times the capacitance surge current I can flow.

Figure 6A:
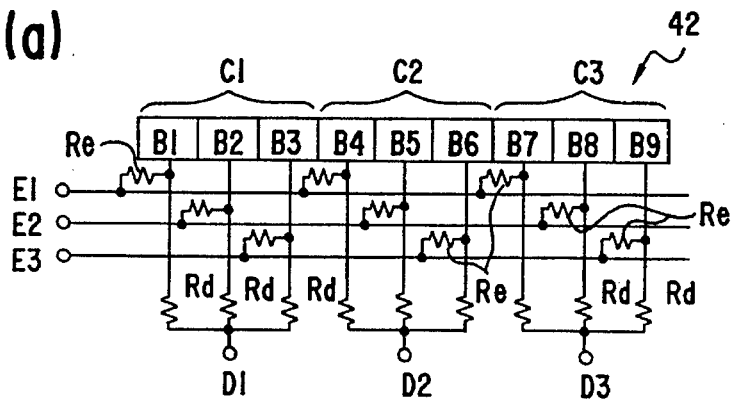
FIG. 6(a) is a circuit diagram of an image reading device which is a simplified version of the embodiment shown in FIG. 3.
Figure 6B:
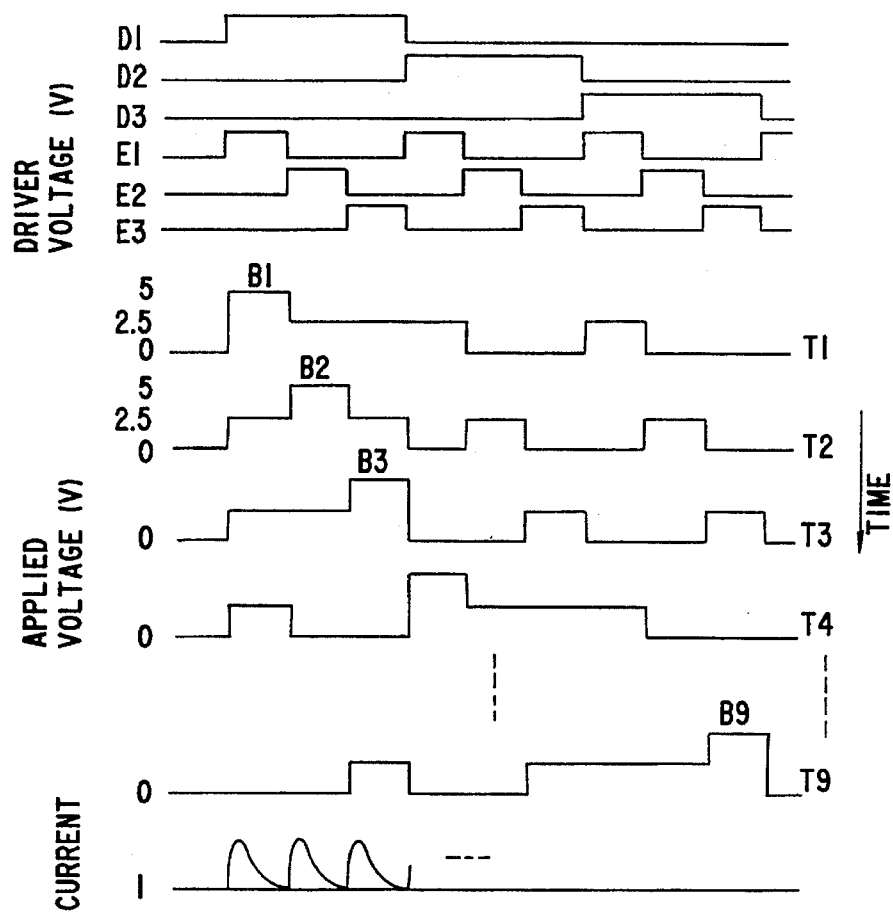
FIG. 6(b) is a timing diagram for explaining the operation of the image reading device shown in FIG. 6(a).

The operation of this image reading device will now be explained by the example of the image reading device 42 shown in FIG. 6(a) which has a drive side made into a 3 by 3 matrix, with reference to the timing diagram shown in FIG. 6(b). This image reading device 42 is a simplification of the image reading device 180 shown in FIG. 3, and since the construction is similar, an explanation is omitted.

The input terminals D1, D2 and D3 and the input terminals E1, E2 and E3 which form the first and second voltage application means, respectively, of the image reading device 42, are connected to the respective output terminals of a shift register via buffer gates, and the data input pulses which are input into this shift register are shifted in sequence within the shift register in accordance with a clock pulse CLK, and are output from each output terminal of the shift register in sequence.

That is to say, the first driving voltage which is input in sequence from the input terminals D1, D2 and D3 is applied via the resistors Rd to the photoelectric energy converting elements of the first blocks B1, B2 and B3, the first blocks B4, B5 and B6 and the first blocks B7, B8 and B9, respectively. Here, the rise and fall of the sequentially input first driving voltages are timed to coincide. The second driving voltage which is input in sequence from the input terminals E1, E2 and E3 is applied via the resistors Re to the photoelectric energy converting elements of the first blocks B1, B4 and B7, the first blocks B2, B5 and B8 and the first blocks B3, B6 and B9, respectively. Here, the rise and fall of the sequentially input second driving voltages are timed to coincide.

As a result of this, the first driving voltage which is sequentially input from the input terminals D1, D2 and D3 and the second driving voltage which is sequentially input from the input terminals E1, E2 and E3 are added by the circuits for addition comprising the resistors Rd and Re, respectively, and when the prescribed applied voltage is attained, the photoelectric energy converting elements of the first blocks B1, B2 . . . B9 are driven. Accordingly, for example, when the first driving voltage is input from the input terminal D1, the photoelectric energy converting elements in the first blocks B1, B2 and B3 become driven in sequence by shifting and applying the second driving voltage in sequence from the input terminals E1, E2 and E3. Furthermore, in a similar manner, when the first driving voltage is input from the input terminal D2, the photoelectric energy converting elements in the first blocks B4, B5 and B6 are driven in sequence by shifting and applying the second driving voltage in sequence from the input terminals E1, E2 and E3.

The changes of applied voltage level between the first blocks B1 and B2 and between the first blocks B2 and B3, when switching, respectively, from T1 to T2 and from T2 to T3 in sequence, and so forth, in this kind of image reading device 42 driven as mentioned above, both by coinciding the rising and falling in the timing of the first and second driving voltages, and by conforming the values of the resistors Rd and Re, are shown in the lower section of Table 1. The results of the totals of the changes of the applied voltage levels summed over all the first blocks B1, B2 . . . B9 are 0, that is to say, the changes are negated between the blocks, so that there is no output of noise.

ductor film is from about 7000 to about 12000 Å, and the thickness of the transparent conductive film is from about 200 to about 800 Å; however, since the film thicknesses are set to meet the required resistance values of the resistors, there is no particular limitation. Following this, etching by photolithography is carried out in the reverse order, so that the upper transparent electrodes 20, the semiconductor layers 22 and the lower electrodes 24 are fabricated, to form the photodiode 10 and the blocking diode 12. At the time of fabricating the lower electrodes 24, are simultaneously

TABLE 1

|    |    |    |    |    |    |    |    |    |    | Vd when Re = Rd |    |    |    |    |       |
|----|----|----|----|----|----|----|----|----|----|----|----|----|----|----|-------|
|    |    |    |    |    | Re | 3  | 3  | 3  | 3  | 3  | 3  | 3  | 3  | 3  |       |
|    |    |    |    |    | Rd | 3  | 3  | 3  | 3  | 3  | 3  | 3  | 3  | 3  |       |
| E1 | E2 | E3 | D1 | D2 | D3 | B1 | B2 | B3 | B4 | B5 | B6 | B7 | B8 | B9 |       |
| 5  | 0  | 0  | 5  | 0  | 0  | 5  | 2.5| 2.5| 2.5|    |    | 2.5|    |    |       |
| 0  | 5  | 0  | 5  | 0  | 0  | 2.5| 5  | 2.5|    | 2.5|    |    | 2.5|    |       |
| 0  | 0  | 5  | 5  | 0  | 0  | 2.5| 2.5| 5  |    |    | 2.5|    |    | 2.5|       |
| 5  | 0  | 0  | 0  | 5  | 0  | 2.5|    |    | 5  | 2.5| 2.5| 2.5|    |    |       |
| 0  | 5  | 0  | 0  | 5  | 0  |    | 2.5|    | 2.5| 5  | 2.5|    | 2.5|    |       |
| 0  | 0  | 5  | 0  | 5  | 0  |    |    | 2.5| 2.5| 2.5| 5  |    |    | 2.5|       |
| 5  | 0  | 0  | 0  | 0  | 5  | 2.5|    |    | 2.5|    |    | 5  | 2.5| 2.5|       |
| 0  | 5  | 0  | 0  | 0  | 5  |    | 2.5|    |    | 2.5|    | 2.5| 5  | 2.5|       |
| 0  | 0  | 5  | 0  | 0  | 5  |    |    | 2.5|    |    | 2.5| 2.5| 2.5| 5  |       |
|    |    |    |    |    |    | Change of applied voltage level of each block |    |    |    |    |    |    |    |    | Total |
| T1 5 | 0 | 0 | 5 | 0 | 0 |    |    |    |    |    |    |    |    |    |       |
| T2 0 | 5 | 0 | 5 | 0 | 0 | -2.5| 2.5| 0 | -2.5| 2.5| 0 | -2.5| 2.5| 0 | 0.00 |
| T3 0 | 0 | 5 | 5 | 0 | 0 | 0 | -2.5| 2.5| 0 | -2.5| 2.5| 0 | -2.5| 2.5| 0.00 |
| T4 5 | 0 | 0 | 0 | 5 | 0 | 0 | -2.5| -5 | 5 | 2.5| 0 | 2.5| 0 | -2.5| 0.00 |
| T5 0 | 5 | 0 | 0 | 5 | 0 | -2.5| 2.5| 0 | -2.5| 2.5| 0 | -2.5| 2.5| 0 | 0.00 |
| T6 0 | 0 | 5 | 0 | 5 | 0 | 0 | -2.5| 2.5| 0 | -2.5| 2.5| 0 | -2.5| 2.5| 0.00 |
| T7 5 | 0 | 0 | 0 | 0 | 5 | 2.5| 0 | -2.5| 0 | -2.5| -5 | 5 | 2.5| 0 | 0.00 |
| T8 0 | 5 | 0 | 0 | 0 | 5 | -2.5| 2.5| 0 | -2.5| 2.5| 0 | -2.5| 2.5| 0 | 0.00 |
| T9 0 | 0 | 5 | 0 | 0 | 5 | 0 | -2.5| 2.5| 0 | -2.5| 2.5| 0 | -2.5| 2.5| 0.00 |

In the above-mentioned embodiments, there is no particular limitation on the method for providing the resistors constituting the circuit for addition from which the matrix driver is constructed. For example, normal external resistors provided by soldering or the like may be used; however, from the viewpoints of reducing the number of production steps and lowering the production costs, the resistors are preferably formed simultaneously with the fabrication of the photoelectric energy converting elements, using the constructing layers which constitute these elements. Embodiments of the image reading device of the present invention in which the matrix driver is constructed using a circuit for addition comprising resistors formed from the constructing layers which constitute the photoelectric energy converting elements will now be described, with reference to the drawings.

Figure 7:
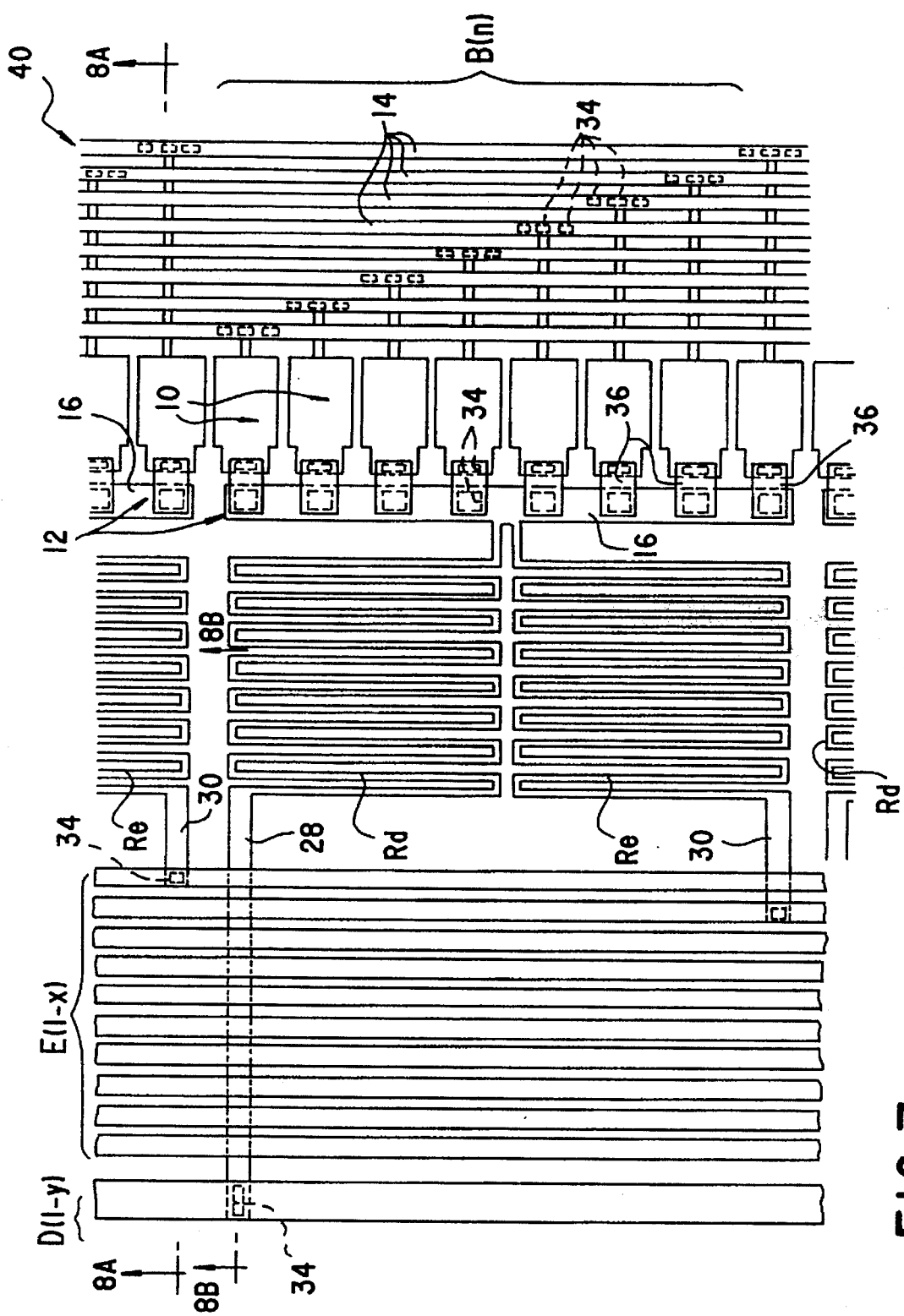
FIG. 7 is a diagram showing the main components of the circuit construction of a first embodiment of the image reading device of the present invention.

FIGS. 7 and 8, respectively, show a plan view and a cross-sectional drawing of the main components of an image reading device 40, the circuit diagram of which is similar to that shown in FIG. 3. Since the basic construction and operation of this embodiment is similar to the above-mentioned embodiments, an explanation is omitted. The following is a brief outline of the production of the image reading device 40 of this kind of structure. On an insulating substrate 18 such as a glass substrate are stacked in order, a lower electrode film of deposited chromium or the like which serves as a lower electrode, a semiconductor film of, for example, amorphous silicon or the like deposited in order in a pin structure or the like, and a transparent conductive film of, for example, ITO or the like, which serves as an upper transparent electrode. Here, the deposition is carried out so that the thickness of the lower electrode film is from about 500 to about 1500 Å, the thickness of the semiconformed integrally an output conductor 26 for connecting the lower electrode 24 with the matrix wiring 14, a common wiring 16 and incorporated adjacent resistors Rd and Re, and moreover, lead-out conductors 28, 30 connected to the input leads $D_{(1-y)}$ and $E_{(1-x)}$ which lead to the input terminals $D_1$, $D_2$, . . . , $D_y$ and $E_1$, $E_2$, . . . , $E_x$, respectively. Here, since the resistors Rd and Re are formed using the same lower electrode film as the lower electrode 24 and so forth, their line width is set to be sufficiently narrow and their length is set to be sufficiently long in order to be able to function as resistors. For example, in the case when chromium is used, since the resistivity is 60 uΩ cm, if a 10 μm wide by 7 mm long by 1000 Å thick resistor body is fabricated, a resistance value of 4.2 kΩ is obtained.

Next, onto the insulating substrate 18 with a fabricated photodiode 10 and so forth, is deposited a transparent interlayer insulating film 32 made of silicon oxide $SiO_x$ or the like, and then contact holes 34 are fabricated at the prescribed positions by photolithography. Then, after depositing a metal film such as aluminum or the like onto the transparent interlayer insulating film 32, the metal film is etched by photolithography to form the matrix wiring 14, the input leads $D_{(1-y)}$ and $E_{(1-x)}$ and the coupling electrode 36 which connects the photodiode 10 and the blocking diode 12. Then, finally, an insulating protective film 38 made of silicon nitride or the like is deposited, to produce the image reading device 40 of the present embodiment. Here, the thickness of the transparent interlayer insulating film 32 is from about 12000 to about 18000 Å and the thickness of the metal film is from about 12000 to about 18000 Å and the thickness of the insulating protective film 38 is from about 3000 to about 8000 Å; however, there is no particular limitation.

An embodiment of the image reading device of the present invention has been explained above in which the resistors constituting the circuit for addition are formed using the material of the lower electrode film; however, the present invention is not limited to the above-mentioned embodiment, and other modes can be implemented.

Figure 9:
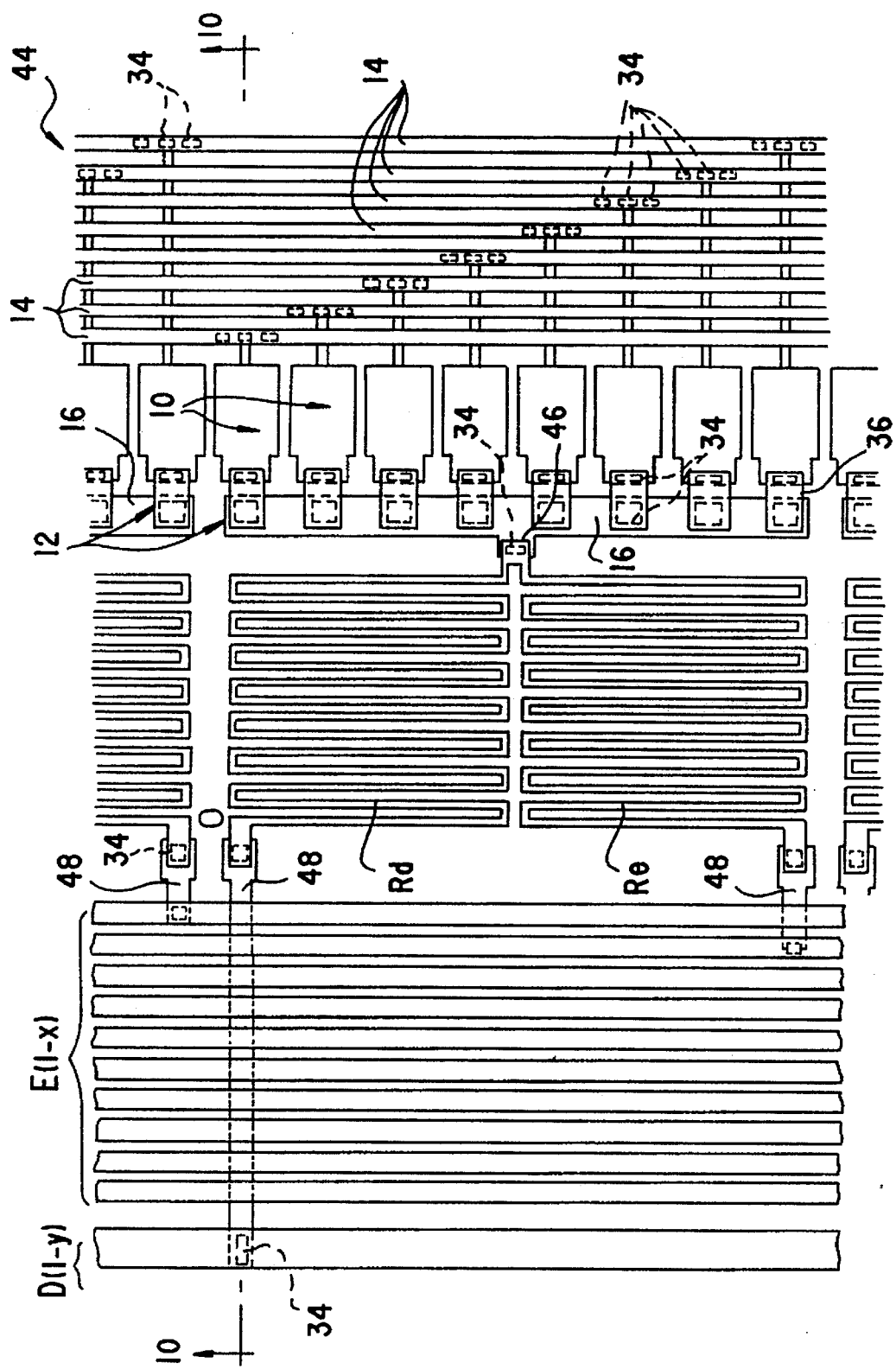
FIG. 9 is a diagram showing the main components of the circuit construction of a second embodiment of the image reading device of the present invention.
Figure 10:
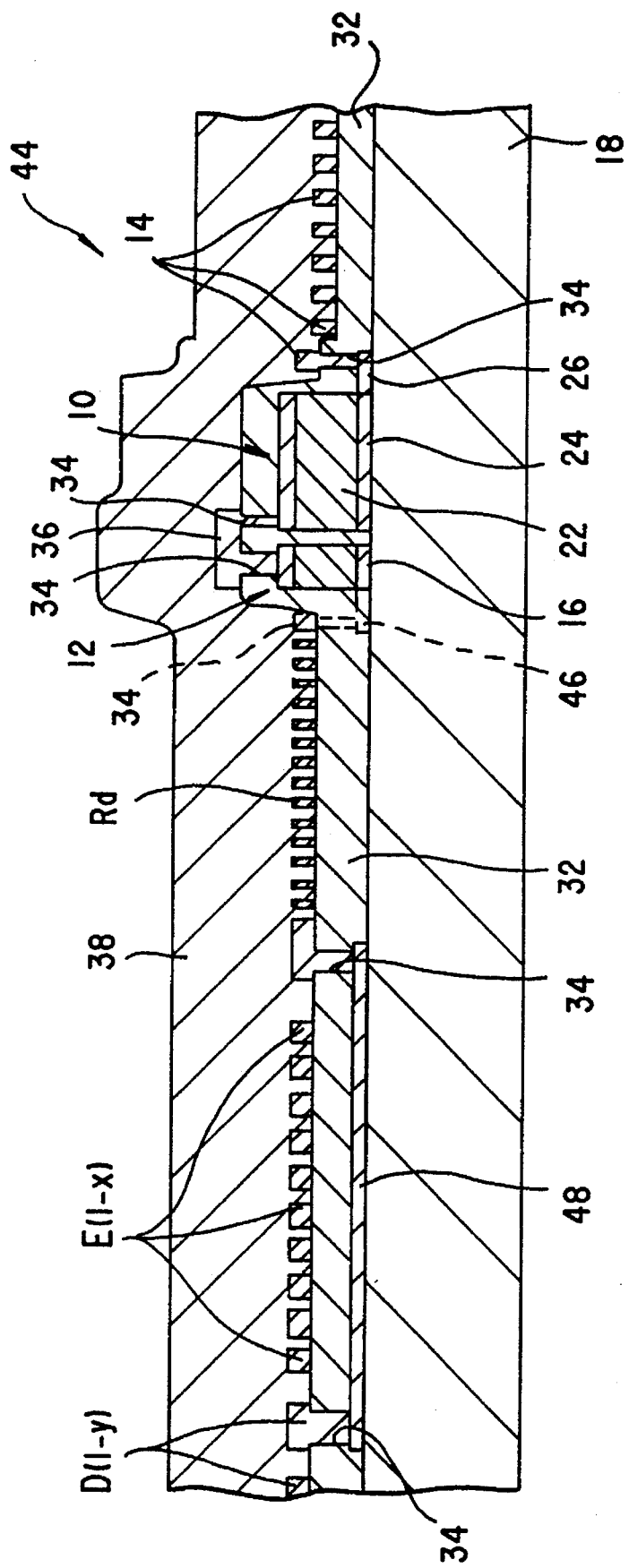
FIG. 10 is a cross-sectional explanatory drawing of the section 10—10 of the image reading device shown in FIG. 9.

For example, as shown in FIGS. 9 and 10, similarly to the above-mentioned embodiment, an image reading device 44 is a one-dimensional array of m by n photoelectric energy converting elements each comprising a photodiode 10 and a blocking diode 12 which is connected in series and opposite polarity to the photodiode 10. The anode terminals of the photodiodes 10 and the anode terminals of the blocking diodes 12 are connected, respectively, to the matrix wiring 14 and the input leads $D_{(1-y)}$ and $E_{(1-x)}$ using an approximately similar construction to the above-mentioned embodiment. In this kind of image reading device 44, the resistors Rd and Re, which are connected to the common wiring 16 of the blocking diode 12, and the input leads $D_{(1-y)}$ and $E_{(1-x)}$ are formed simultaneously with the coupling electrode 36 which connects the upper transparent electrodes of the photodiode 10 and the blocking diode 12, and these are connected to the lead-out conductors 46, 48 by using contact holes 34 formed in the transparent interlayer insulating film 32.

In the production method of the image reading device 44 of this kind of construction, using normal methods, photodiodes 10 and blocking diodes 12 are fabricated on an insulating substrate 18, and an output conductor 26 is fabricated integrally from the lower electrode 24 of each photodiode 10. Furthermore, lead-out conductors 46 and 48 are formed integrally extending out from the common wiring 16 of the blocking diode 12. Then, after fabricating contact holes 34 in the transparent interlayer insulating film 32 formed on the photodiode 10 and so forth, a metal film of aluminum or the like is deposited, and further, this metal film is etched using photolithography or the like, to form the coupling electrode 36, the matrix wiring 14, and the circuit for addition comprising the resistors Rd and Re and the input leads $D_{(1-y)}$ and $E_{(1-x)}$, which are connected via the contact holes 34. Following this, an insulating protective film 38 is deposited, to produce the image reading device 44. In the image reading device 44 of this kind of construction, the circuit for addition comprising the resistors Rd and Re is formed from the material of the coupling electrode 36; for example, in the case when aluminum is used, the resistivity is 3 $\mu\Omega$ cm, so that if a 10 $\mu$m wide by 7 mm long by 1000 Å thick resistor body is fabricated, a resistance value of 210 $\Omega$ is obtained.

Figure 11:
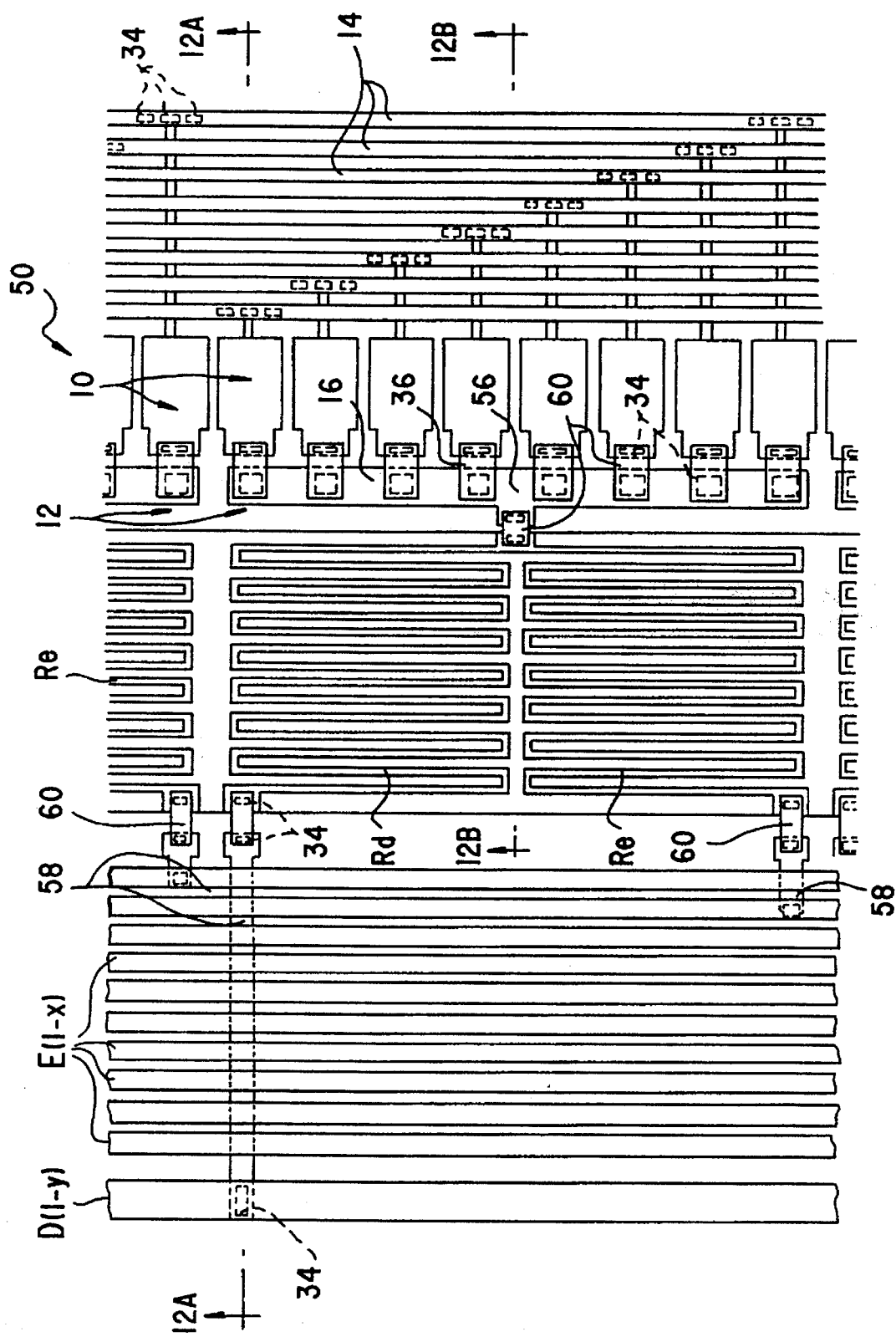
FIG. 11 is a diagram showing the main components of the circuit construction of a third embodiment of the image reading device of the present invention.
Figures 12A, 12B:
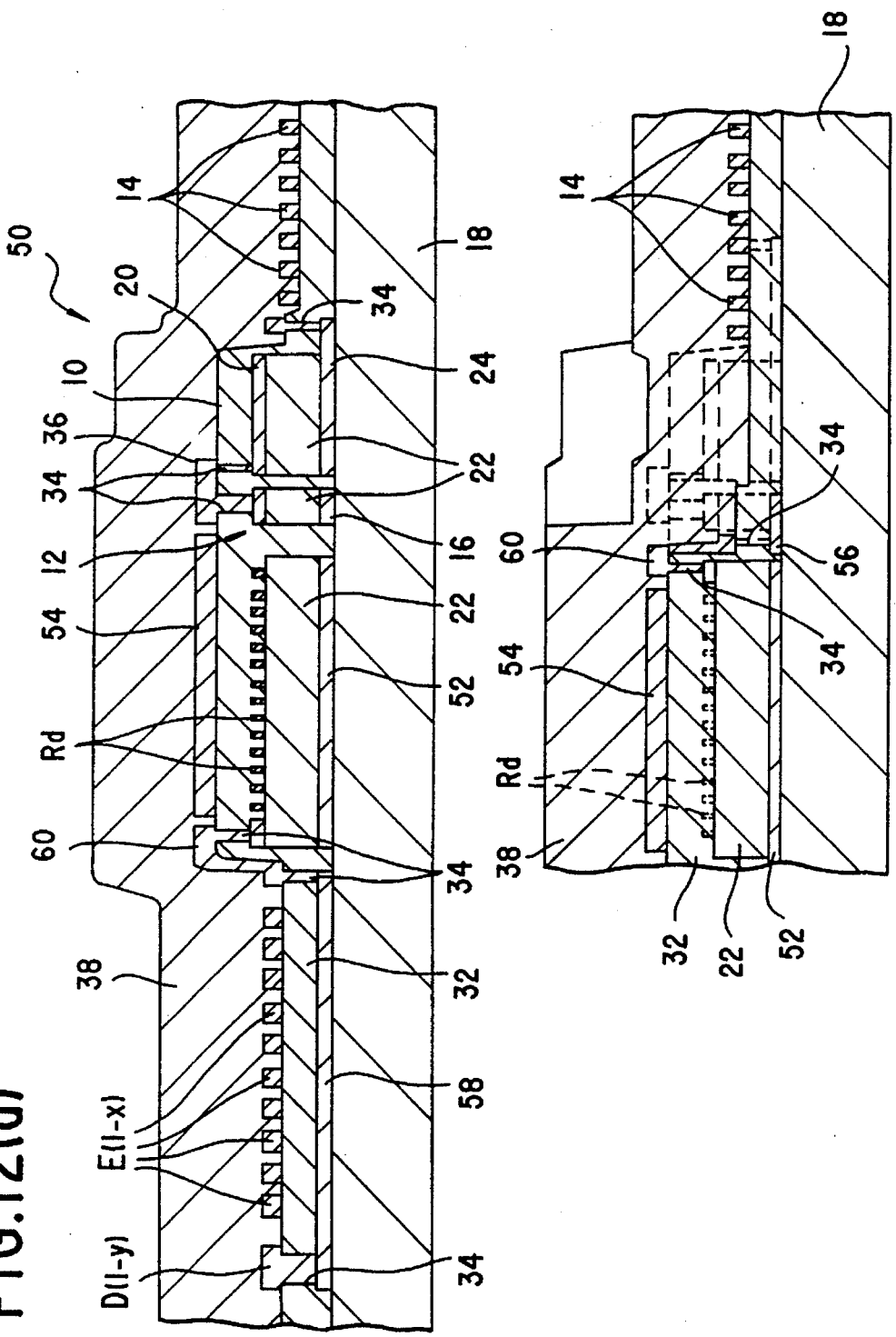
FIG. 12(a) is a cross-sectional explanatory drawing of the section 12A—12A of the image reading device shown in FIG. 11.
FIG. 12(b) is a cross-sectional drawing of the section 12B—12B of the image reading device shown in FIG. 11.

Now, as shown in FIGS. 11 and 12, in an image reading device 50, it is also possible to fabricate the circuit for addition comprising the resistors Rd and Re on top of the semiconductor layer 22 made of amorphous silicon or the like by using the ITO or the like which forms the upper transparent electrode 20 of the photodiode 10 and so forth. That is to say, after depositing a lower electrode film which forms the lower electrodes 24, a semiconductor film which forms the semiconductor layers 22 and a transparent conductive film which forms the upper transparent electrodes 20 in order on an insulating substrate 18, etching using photolithography or the like is carried out in the reverse order, and at the time of the formation of the upper transparent electrodes 20 and so forth, the resistors Rd and Re are formed simultaneously using the transparent conductive film made of ITO or the like. Since a transparent conductive film made of ITO or the like has a comparatively high resistance, resistors Rd and Re of the desired resistance value are easily fabricated, which is an advantage. For example, the resistivity of ITO is 500 $\mu\Omega$ cm, so that by fabricating a 10 $\mu$m wide by 7 mm long by 1000 Å thick resistor body, a resistance value of 35 k$\Omega$ is obtained.

In this kind of construction, since the circuit for addition comprising the resistors Rd and Re is fabricated by stacking on top of the lower electrode film 52 which forms the lower electrodes 24 and so forth and the semiconductor layers 22, when light enters the parts of the resistors Rd and Re, a photoelectromotive force is generated. Therefore, a light-shielding film 54 is set up on the upper side of the resistors Rd and Re via the transparent interlayer insulating film 32. Furthermore, since the lower electrode film 52 exists as a common line to the circuit for addition comprising the resistors Rd and Re, a terminal is preferably set up on the lower electrode film 52, and a reverse bias voltage is applied to the semiconductor layer 22 on this film or it is otherwise grounded so as to give 0 V (zero bias).

Furthermore, in this kind of construction, the semiconductor layer 22 which is formed beneath the parts of the circuit for addition made from the resistors Rd and Re, may, as shown in FIG. 12, be etched in a pattern different from the pattern of the resistors Rd and Re. However, in order to reduce the number of resist film fabrication steps, this semiconductor layer 22 may also be etched in the same pattern as that of the resistors Rd and Re.

Here, in the above-mentioned image reading device 50, the circuit for addition made from the resistors Rd and Re which are fabricated on top of the semiconductor layer 22 is, as shown in FIG. 12, enveloped with a transparent interlayer insulating film 32, and the resistors Rd and Re and the input leads $D_{(1-y)}$ and $E_{(1-x)}$ which supply the driving voltage to the resistors Rd and Re are connected by using the lead-out conductors 56, 58, the coupling electrode 60 and contact holes 34 formed in the transparent interlayer insulating film 32. The common wiring 16 formed to the anode terminal of the blocking diode 12 and the resistors Rd and Re are connected by the coupling electrode 60 through another contact hole 34 formed in the transparent interlayer insulating film 32.

Detailed accounts of typical embodiments of the image reading device of the present invention have been given above; however, the image reading device of the present invention is not limited to the above-mentioned embodiments, and other modes can also be implemented.

Figure 13:
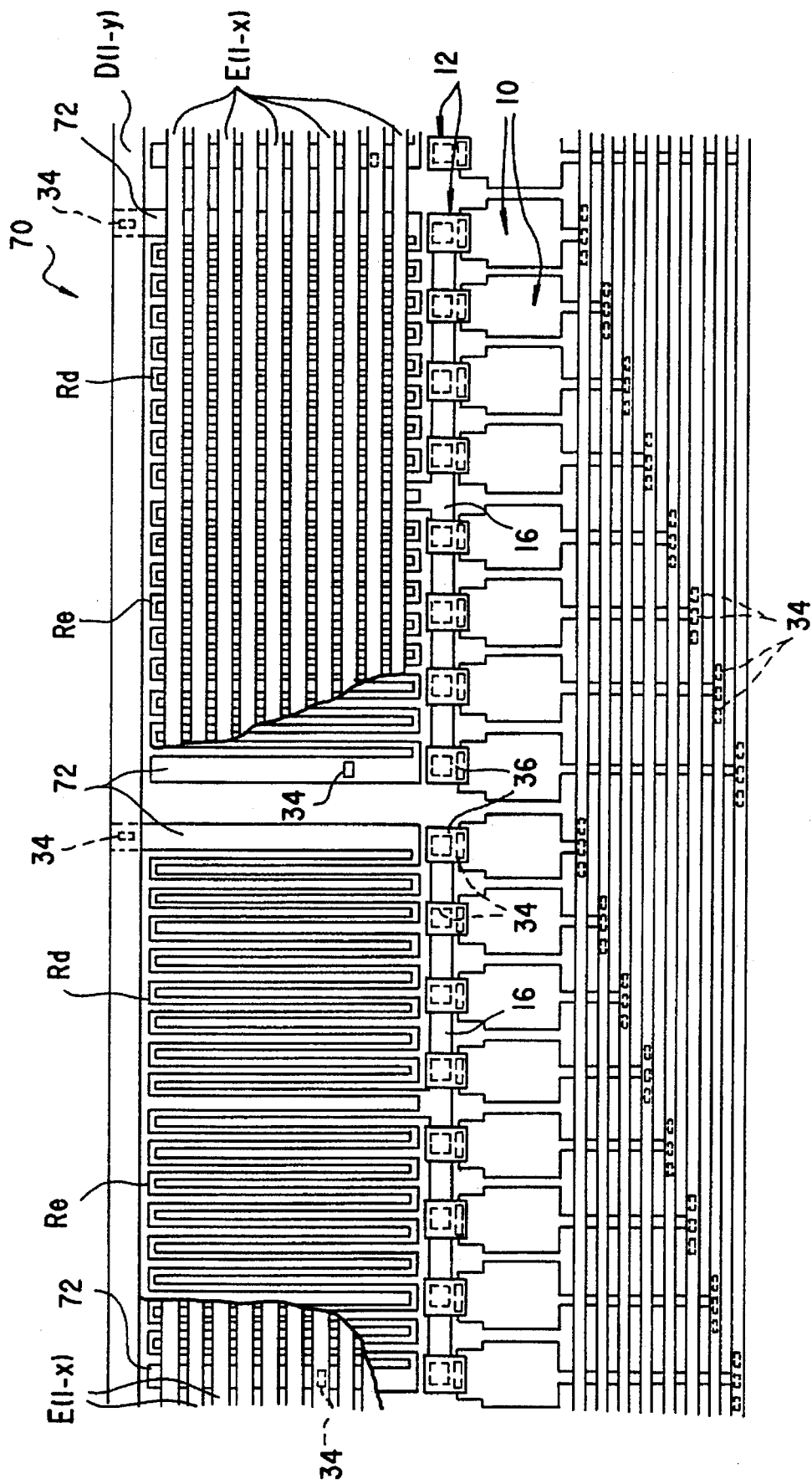
FIG. 13 is a diagram showing the main components of the circuit construction of a fourth embodiment of the image reading device of the present invention.

For example, as shown in FIG. 13, an image reading device 70 of the present invention can also have the input leads $D_{(1-y)}$ and $E_{(1-x)}$ installed via the transparent interlayer insulating film on the circuit for addition comprising the resistors Rd and Re. That is to say, the resistors Rd and Re are fabricated integrally with the common wiring 16 of the blocking diode 12 on the insulating substrate 18, and terminal parts 72 which cannot function as resistors are set up at the other ends of the resistors Rd and Re than those extending from the common wiring 16. Next, after setting up contact holes 34 in the transparent interlayer insulating film formed on the resistor Rd and Re parts and so forth, in the prescribed positions, and so forth, of the terminal parts 72, the coupling electrode 36 which connects the photodiode 10 and the blocking diode 12, and the input leads $D_{(1-y)}$ and $E_{(1-x)}$ are fabricated, so that the terminal parts 72 of the resistors Rd and Re are connected via the contact holes 34 to the input leads $D_{(1-y)}$ and $E_{(1-x)}$.

By adopting this kind of construction, not only extreme miniaturization of the image reading device 70 is possible, but since it is also possible to obtain the production of many image reading devices 70 from one insulating substrate, the production cost can be reduced.

Figure 14:
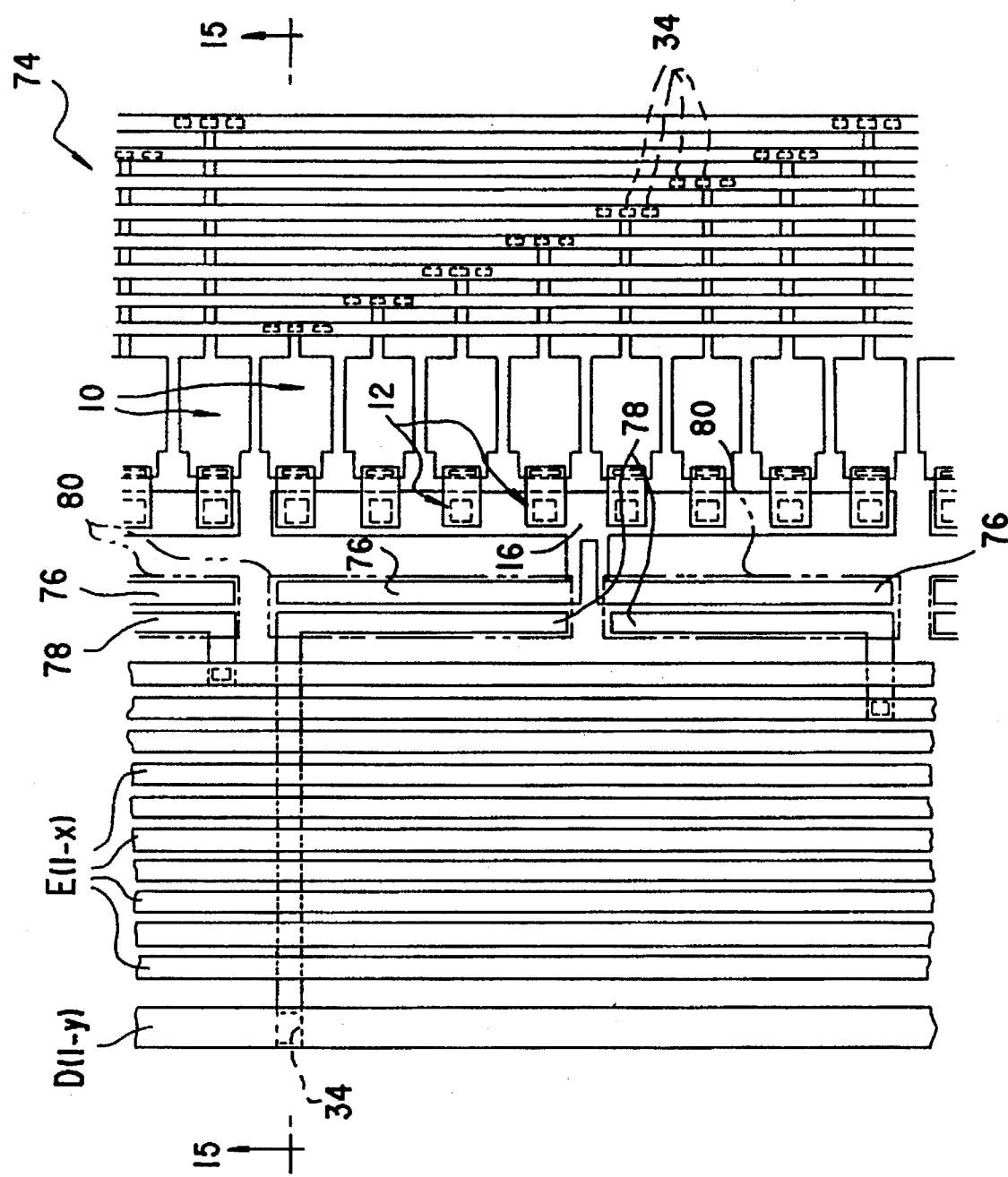
FIG. 14 is a diagram showing the main components of the circuit construction of a fifth embodiment of the image reading device of the present invention.
Figure 15:
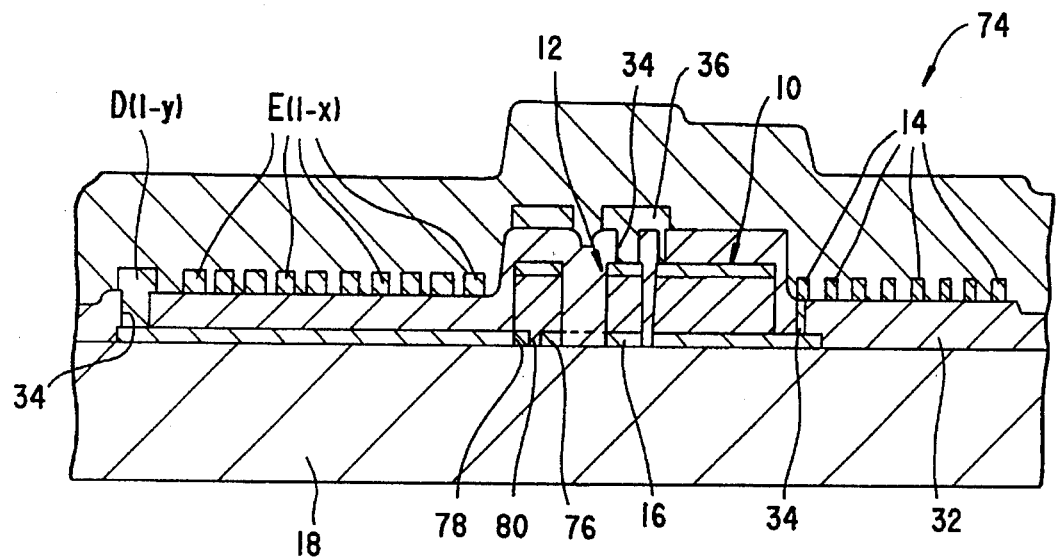
FIG. 15 is a cross-sectional explanatory drawing of the section 15A—15A of the image reading device shown in FIG. 14.

Now, as shown in FIGS. 14 and 15, it is possible to form the resistors Rd and Re which constitute the circuit for addition of an image reading device 74 by using a resistance body 80 made from the counter electrodes 76, 78 and the semiconductor layer of amorphous silicon or the like. That is to say, the counter electrodes 76, 78 are, for example, fabricated integrally with the common wiring 16 or the like, and the semiconductor layer which constitutes the photodiode 10 and so forth is formed on this counter electrode 76, 78 part, so that this is used as the resistance body. Since the electrical conductivity of the semiconductor of amorphous silicon or the like is from about $10^3$ to about $10^{-8}$ $(\Omega cm)^{-1}$, the required resistance value can be suitably set by adjusting the space between the counter electrodes 76, 78 and the counter electrode length.

In an image reading device having this kind of construction, it is also possible to fabricate the counter electrodes by using the upper transparent electrode made of ITO or the like. Furthermore, the semiconductor which is used as the resistors may be any of a p-type semiconductor, an n-type semiconductor or an i-type semiconductor, or the like; however, even a semiconductor with a comparatively high electrical conductivity such as μc-n-type hydrogenated amorphous silicon or the like having, for example, an electrical conductivity of about $10^{-3}$ to about $10^0$ $(\Omega cm)^{-1}$ may be used. Here, the μc-n-type hydrogenated amorphous silicon is a hydrogenated amorphous silicon which can be doped with phosphorous (P) or another Group 5 element of the Periodic Table.

Furthermore, in the above-mentioned embodiment, the counter electrodes 76, 78 which constitute the resistors were fabricated using the lower electrode film which was formed on the insulating substrate 18. However, it is also possible to fabricate one side of the counter electrodes using the lower electrode film and to fabricate the other side using the upper transparent electrode film. In the present example, of the semiconductor layers which constitute the resistor body, that is to say, a p-type semiconductor layer, an i-type semiconductor layer or an n-type semiconductor layer or the like, it is preferred that, for example the construction is made so that an i-type semiconductor layer or the like is not deposited.

A detailed explanation has been given above of the image reading method of the present invention and embodiments of image reading devices directly used to execute this method; however, the present invention is not limited to the above-mentioned embodiments, and other modes can be implemented.

Figure 16:
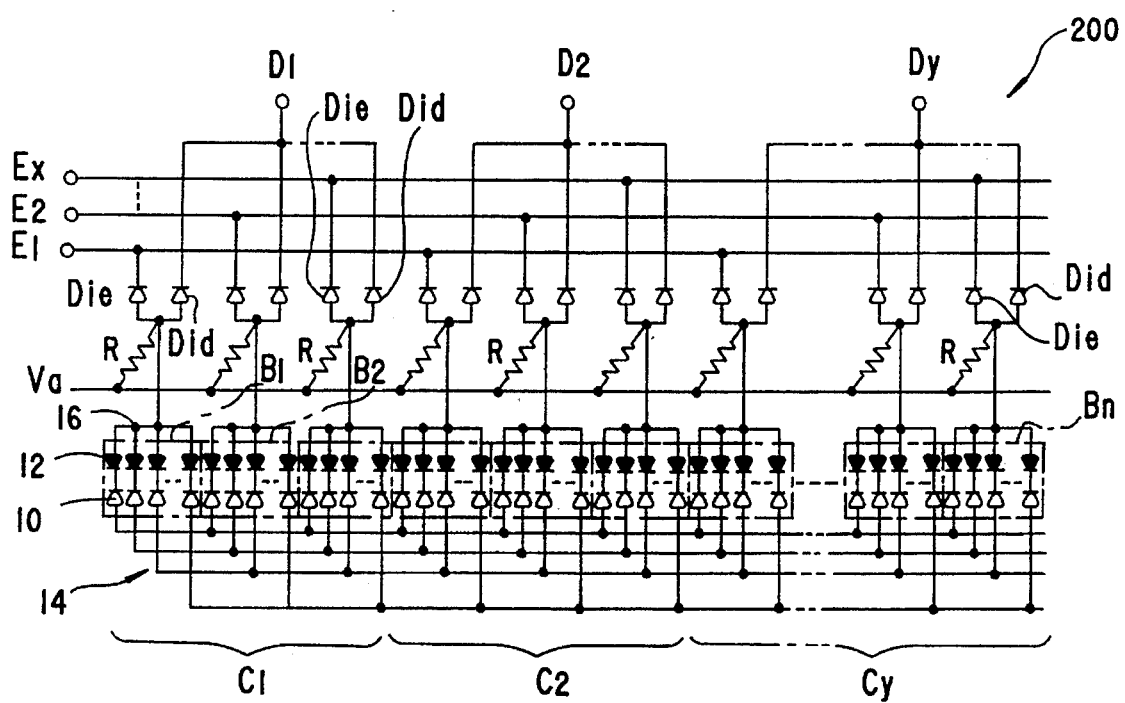
FIG. 16 is a circuit diagram showing a sixth embodiment of the image reading method and device thereof of the present invention.

For example, as shown in FIG. 16, an image reading device 200 is, in a manner similar to the above-mentioned embodiments, a one-dimensional array of m by n photoelectric energy converting elements of photodiodes 10 and blocking diodes 12 which are connected in series and opposite polarity with these photodiodes 10. The anode terminals of the photodiodes 10 in the same relative positions in the respective first blocks $B_1, B_2, \ldots, B_n$ are connected together in a common matrix wiring 14, to give a similar construction.

On the other hand, the anode terminals of the blocking diodes 12 are, in a manner similar to the above-mentioned, commonly connected within each of the respective first blocks $B_1, B_2, \ldots, B_n$ by common wirings 16, and the first blocks $B_1, B_2, \ldots, B_n$ which are divided into n blocks are further divided every x first blocks into y second blocks $C_1$, $C_2, \ldots, C_y$. Then, in order that the first driving voltage can be applied in sequence to the units of x first blocks $B_1, B_2, \ldots, B_x$ in the respective second blocks $C_1, C_2, \ldots, C_y$, the common wirings 16 of the first blocks $B_1, B_2, \ldots, B_x$ are connected commonly to the respective input terminals $D_1$, $D_2, \ldots, D_y$ via diodes Did. Moreover, the construction is made so that the common wirings 16 of the first blocks $B_1$, $B_2, \ldots, B_x$ in the same relative positions in the second blocks $C_1, C_2, \ldots, C_y$ are connected commonly to the respective input terminals $E_1, E_2, \ldots, E_x$ via diodes Die, so that the second driving voltage can be applied both individually and in sequence to the first blocks $B_1, B_2, \ldots, B_x$ in each of the second blocks $C_1, C_2, \ldots, C_y$. Then the anode terminals of the diodes Did and Die are connected to the respective blocking diode 12 anode terminals in series, and a bias voltage Va is applied via resistors R to this anode terminal side.

Figure 17:
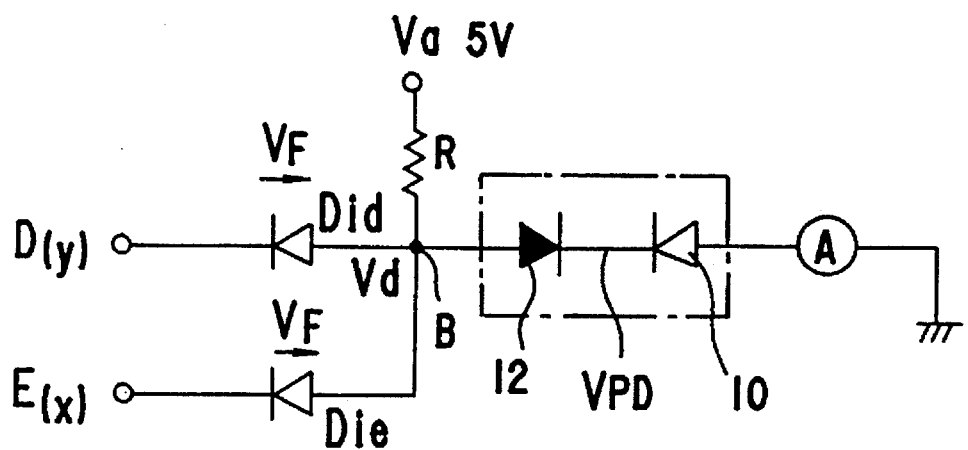
FIG. 17 is a diagram explaining the basic construction and the basic operation of the image reading apparatus and method shown in FIG. 16.

Here, as shown in FIG. 17, in any first block $B_1, B_2, \ldots, B_n$, any pair of a photodiode 10 and a blocking diode 12 are in opposition, the diode Did and the diode Die are connected, a bias voltage Va= 5 V is applied via the resistor R, and an AND circuit is formed from the diodes. Accordingly, if the forward voltage $V_F \sim 0$ V, ideally there is no output and when a first driving voltage D= 5 V, and a second driving voltage E= 5 V are input from the input terminals $D_{(y)}$ and $E_{(x)}$, respectively, the electrical potential Vd at the point B is 5 V, to give the read-out state. Next, when the first driving voltage D= 0 v and the second driving voltage E= 0 V, the potential Vd at the point B is 0 V, and further, when D= 0 V and E= 5 V or when D= 5 V and E= 0 V are input, the point B has a potential Vd of 0 V, any of which conditions gives the storage state, in which there is no read-out.

Furthermore, if there is a forward voltage $V_F$= 1 V, when a first driving voltage D= 5 V and a second driving voltage E=5 V are input from the input terminals $D_{(y)}$ and $E_{(x)}$, respectively, the electrical potential Vd at the point B is 5 V, and the read-out state is entered. Next, when the first driving voltage D=0 V and the second driving voltage E= 0 V, the potential Vd at the point B becomes 0.5 V, and further, when D= 0 V and E= 5 V or when D= 5 V and E= 0 V is input, the potential Vd at the point B becomes 1 V. Accordingly, in this case, if the electrical potential $V_{PD}$ between the photodiode 10 and the blocking diode 12 does not fall to 1 V or below, the storage state is maintained and there is no read out.

Figures 18A, 18B:
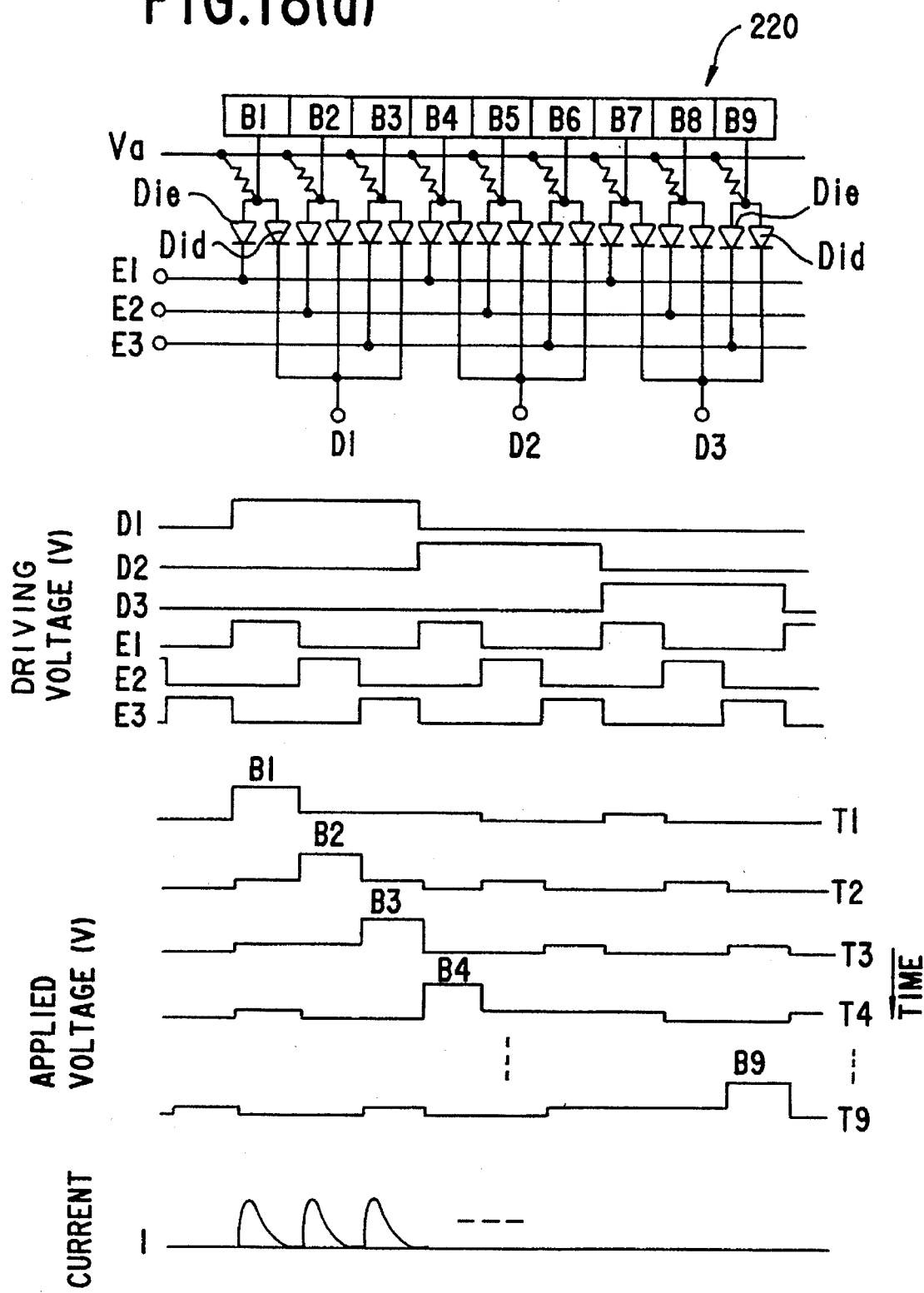
FIG. 18(a) is a circuit diagram of an image reading apparatus and method which is a simplified version of the embodiment shown in FIG. 16.
FIG. 18(b) is a timing diagram explaining the operation of the image reading apparatus and method and represented by the circuit diagram shown in FIG. 18(a).

The operation of this image reading device will now be explained by an exemplary image reading device 220 in which the drive side is made into a 3 by 3 matrix, shown in FIG. 18(a), with reference to the time chart shown in FIG. 18(b). This image reading device 220 is a simplification of the image reading device 200 shown in the above-mentioned FIG. 16, so that since the construction is similar, the description is omitted.

The input terminals D1, D2 and D3 and the input terminals E1, E2 and E3 which constitute the first and second voltage application means, respectively, of the image reading device 220, are connected to the respective output terminals of a shift register via buffer gates, and the data input pulses which are input into this shift register are shifted in sequence within the shift register according to a clock pulse CLK, and are output from each output terminal of the shift register in sequence. That is to say, the first driving voltage which is input in sequence from the input terminals D1, D2 and D3 is applied to the diodes Did of the first blocks B1, B2 and B3, the first blocks B4, B5 and B6 and the first blocks B7, B8 and B9, respectively. Here, the rise and fall of the sequentially input first driving voltages are timed to coincide. The second driving voltage which is input in sequence from the input terminals E1, E2 and E3 is applied to the diodes Die of the first blocks B1, B4 and B7, the first blocks B2, B5 and B8 and the first blocks B3, B6 and B9, respectively. Here, the rise and fall of the sequentially input second driving voltages are timed to coincide.

As a result, when the first driving voltage which is input sequentially from the input terminals D1, D2 and D3 and the second driving voltage which is input sequentially from the input terminals E1, E2 and E3 are in accord in the AND circuits comprising the diodes Did and the diodes Die, respectively, the applied voltage is output, and the photoelectric energy converting elements of the first blocks B1, B2 . . . B9 are driven. Accordingly, for example, when the first driving voltage is input from the input terminal D1, the photoelectric energy converting elements in the first blocks B1, B2 and B3 are driven in sequence by shifting and applying the second driving voltage in sequence from the input terminals E1, E2 and E3. Furthermore, in a similar manner, when the first driving voltage is input from the input terminal D2, the photoelectric energy converting elements in the first blocks B4, B5 and B6 are driven in sequence by shifting and applying the second driving voltage in sequence from the input terminals E1, E2 and E3.

The changes of applied voltage level between the first blocks B1 and B2 and between the first blocks B2 and B3, when switching, respectively, from T1 to T2 and from T2 to T3 in sequence, and so forth, in this kind of image reading device 220 driven as mentioned above, both by coinciding the rising and falling in the timing of the first and second driving voltages, and by conforming the values of the forward voltage $V_F$ in each diode Did and Die, are shown in the lower section of Table 2. The results of the totals of the changes of the applied voltage levels summed over all the first blocks B1, B2 . . . B9 are 0, that is to say, the changes are negated between the blocks, so that there is no output of noise.

multichannel is made, and any number of channels can be set up to comply with the sensor response.

Figure 19A:
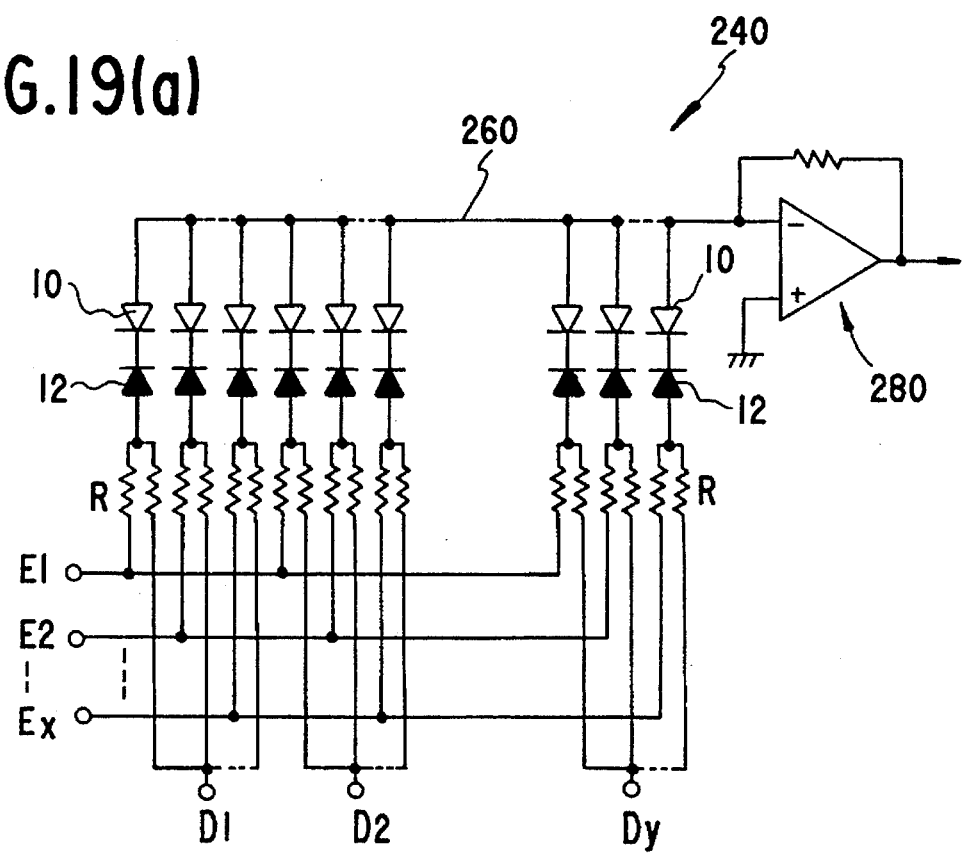
FIG. 19(a) is a circuit diagram illustrating a seventh embodiment of the image reading apparatus and method of the present invention.

For example, as shown in FIG. 19(a), it is possible to construct an image reading device 240 with one channel. That is to say, in photoelectric energy converting elements each made from one pair of a photodiode 10 and a blocking diode 12, the construction is such that the anode side of the photodiodes 10 is completely connected by a common lead 260, and the output is made through a current amplification circuit 280. On the other hand, on the anode side of each blocking diode 12, two resistors R of the same value are connected in parallel to form a circuit for addition, division is made into y blocks $B_1, B_2, \ldots, B_y$, each with a set number of x photoelectric energy converting elements, and the resistors R on one side in each respective block $B_1, B_2, \ldots, B_y$ are connected commonly to respective input terminals $D_1, D_2, \ldots, D_y$. Moreover, the corresponding resistors R on the other side on the photoelectric energy converting elements in the same relative positions in the respective blocks $B_1, B_2, \ldots, B_y$ are connected together to the input terminals $E_1, E_2, \ldots, E_x$ to make the construction.

Figure 19B:
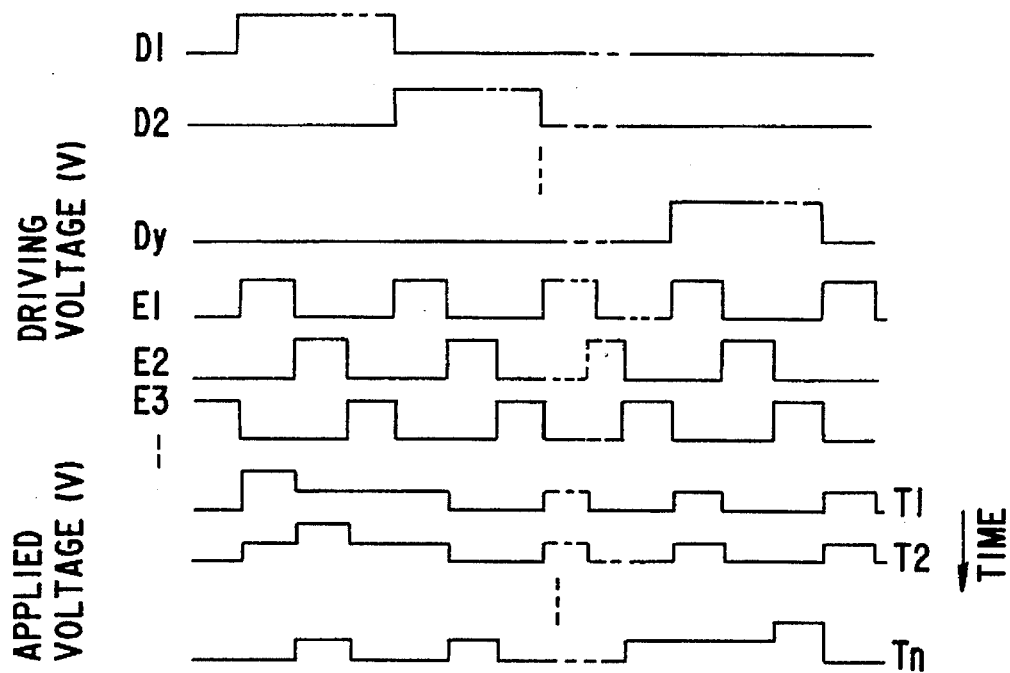
FIG. 19(b) is a timing diagram for explaining the operation of the embodiment of the image reading apparatus and method shown in FIG. 19(a).

As shown in the time chart in FIG. 19(b), in this kind of image reading device 240, the first driving voltage D1, D2, . . . , Dy is shifted and input in sequence from the respective input terminals $D_1, D_2, \ldots, D_y$, while the second driving voltage E1, E2, . . . , Ex is input in sequence from the respective input terminals $E_1, E_2, \ldots, E_x$. Accordingly, the first driving voltage D1, D2, . . . , Dy and the second driving voltage E1, E2, . . . , Ex are added, and the photoelectric energy converting elements which have attained the prescribed applied voltage are driven, so that as shown in the time chart, the photoelectric energy converting elements each comprising a photodiode 10 and a blocking diode 12 are driven and read out in sequence.

The present embodiment is constructed using circuits for addition comprising resistors as, a matrix driver; however, it is also possible to adopt a circuit construction similar to that

TABLE 2

|    | E1 | E2 | E3 | D1 | D2 | D3 | B1 | B2 | B3 | B4 | B5 | B6 | B7 | B8 | B9 | |
|----|----|----|----|----|----|----|----|----|----|----|----|----|----|----|----|---|
|    |    |    |    |    |    |    | \multicolumn{9}{c}{$V_d$ when $V_F$ of Di = 1 V} | |
|    | 5  | 0  | 0  | 5  | 0  | 0  | 5  | 1  | 1  | 1  | 0.5 | 0.5 | 1 | 0.5 | 0.5 | |
|    | 0  | 5  | 0  | 5  | 0  | 0  | 1  | 5  | 1  | 0.5 | 1  | 0.5 | 0.5 | 1 | 0.5 | |
|    | 0  | 0  | 5  | 5  | 0  | 0  | 1  | 1  | 5  | 0.5 | 0.5 | 1  | 0.5 | 0.5 | 1 | |
|    | 5  | 0  | 0  | 0  | 5  | 0  | 1  | 0.5 | 0.5 | 5  | 1  | 1  | 1  | 0.5 | 0.5 | |
|    | 0  | 5  | 0  | 0  | 5  | 0  | 0.5 | 1 | 0.5 | 1  | 5  | 1  | 0.5 | 1 | 0.5 | |
|    | 0  | 0  | 5  | 0  | 5  | 0  | 0.5 | 0.5 | 1 | 1  | 1  | 5  | 0.5 | 0.5 | 1 | |
|    | 5  | 0  | 0  | 0  | 0  | 5  | 1  | 0.5 | 0.5 | 1  | 0.5 | 0.5 | 5 | 1 | 1 | |
|    | 0  | 5  | 0  | 0  | 0  | 5  | 0.5 | 1 | 0.5 | 0.5 | 1 | 0.5 | 1 | 5 | 1 | |
|    | 0  | 0  | 5  | 0  | 0  | 5  | 0.5 | 0.5 | 1 | 0.5 | 0.5 | 1 | 1 | 1 | 5 | |
|    |    |    |    |    |    |    | \multicolumn{9}{c}{Change of applied voltage level of each block} | Total |
| T1 | 5  | 0  | 0  | 5  | 0  | 0  |    |    |    |    |    |    |    |    |    | |
| T2 | 0  | 5  | 0  | 5  | 0  | 0  | −4 | 4  | 0  | −0.5 | 0.5 | 0  | −0.5 | 0.5 | 0  | 0.00 |
| T3 | 0  | 0  | 5  | 5  | 0  | 0  | 0  | −4 | 4  | 0  | −0.5 | 0.5 | 0  | −0.5 | 0.5 | 0.00 |
| T4 | 5  | 0  | 0  | 0  | 5  | 0  | 0  | −0.5 | −4.5 | 4.5 | 0.5 | 0  | 0.5 | 0  | −0.5 | 0.00 |
| T5 | 0  | 5  | 0  | 0  | 5  | 0  | −0.5 | 0.5 | 0  | −4 | 4  | 0  | −0.5 | 0.5 | 0  | 0.00 |
| T6 | 0  | 0  | 5  | 0  | 5  | 0  | 0  | −0.5 | 0.5 | 0  | −4 | 4  | 0  | −0.5 | 0.5 | 0.00 |
| T7 | 5  | 0  | 0  | 0  | 0  | 5  | 0.5 | 0  | −0.5 | 0  | −0.5 | −4.5 | 4.5 | 0.5 | 0  | 0.00 |
| T8 | 0  | 5  | 0  | 0  | 0  | 5  | −0.5 | 0.5 | 0  | −0.5 | 0.5 | 0  | −4 | 4  | 0  | 0.00 |
| T9 | 0  | 0  | 5  | 0  | 0  | 5  | 0  | −0.5 | 0.5 | 0  | −0.5 | 0.5 | 0  | −4 | 4  | 0.00 |

Now, the image reading apparatus and method of the present invention are not limited to systems such as are illustrated in the above-mentioned embodiments in which photoelectric energy converting elements comprising photodiodes 10 and blocking diodes 12 are divided every fixed number of diode pairs into a plurality of blocks and a mentioned above by using AND circuitry which uses diodes. Regardless of the construction, the output system from the anode terminals of the photodiodes 10 are in a single line, so that the current amplification circuits and so forth may be made in only one series, and because the other circuits are digital parts, a cheaper image reading device can be offered.

Now, in the above-mentioned embodiments, the cathode terminals of the photodiodes 10 and blocking diodes 12 were connected together; however, in the reverse configuration, the anode terminals of the photodiodes 10 and blocking diodes 12 may be connected together, the cathode terminals of the photodiodes 10 may be connected to the resistors which constitute the circuit for addition or with the anode terminals of the diodes which constitute the AND circuit, and the cathode terminals of the blocking diodes 12 may be connected to the current amplification circuits. Furthermore, the present invention can also be applied to a type of selection drive which uses a TFT or the like without a blocking diode 12, and moreover not only a contact type but also a so-called completely contact type image reading device can be applied as a matter of course.

Furthermore, the above-mentioned AND circuit using diodes which is a matrix driver was constructed with positive logic AND circuitry; however, it can also be constructed with negative logic AND circuitry having diodes and a bias electric source of reverse polarity. Moreover, while AND circuitry using diodes is the most preferred, AND circuitry of other constructions may also be used as a matter of course.

In addition, the diodes constituting the AND circuit are most preferably fabricated by utilizing the amorphous semiconductor or crystalline semiconductor which constitutes the photodiodes 10 and blocking diodes 12. Furthermore, the resistors which constitute the circuit for addition or the AND circuit may be fabricated separately by using a wire pattern or the like and evaporating the resistor substance, or it is also possible to fabricate the resistors by utilizing a comparatively well conducting portion within the semiconductor layer.

As mentioned above, in the image reading method and device thereof of the present invention, the drive side of the photoelectric energy converting elements is made into a driving matrix, so that it is possible to implement various kinds of additional construction in this kind of method and device.

For example, concerning a similar construction to the present invention, in an image reading method in which a driving voltage is applied in sequence to a plurality of photoelectric energy converting elements disposed in a one-dimensional array and the electrical signals of said photoelectric energy converting elements are read out, the construction may be made so that before applying the driving voltage to the above-mentioned photoelectric energy converting elements, two or more repetitions may carried out in which a driving voltage is applied in sequence to a plurality of dummy photoelectric energy converting elements having approximately the same properties as said photoelectric energy converting elements.

According to this kind of image reading method, prior to applying the driving voltage to the proper photoelectric energy converting elements, a driving voltage is sequentially applied to the plurality of dummy photoelectric energy converting elements, and further, the driving voltage is sequentially applied at least one more time to these dummy photoelectric energy converting elements. In short, between applying the driving voltage to the first dummy photoelectric energy converting element, and applying the driving voltage to the first photoelectric energy converting element, the driving voltage is applied several times to the dummy photoelectric energy converting elements. Accordingly, the capacitance surge arising when the driving voltage is applied to the first dummy photoelectric energy converting element is sufficiently dissipated during this time. As a result, the only signal component included in the electrical signal which is read out is that from the photoelectric energy converting elements. Furthermore, because repetitions of driving voltage are applied to a plurality of the same dummy photoelectric energy converting elements, it is possible to manage with a comparatively small number of dummy photoelectric energy converting elements necessary for the dissipation of the capacitance surge generated initially.

Furthermore, in an image reading device of a similar construction to the present invention, in which a driving voltage is applied sequentially to a plurality of photoelectric energy converting elements disposed in a one-dimensional array and the electrical signals from said photoelectric energy converting elements are read out, the construction may provide a plurality of dummy photoelectric energy converting elements having approximately the same properties as the above-mentioned photoelectric energy converting elements, together with an initializing means which carries out two or more repetitions of the application of a driving voltage in sequence to said dummy photoelectric energy converting elements before applying the driving voltage to the above-mentioned photoelectric energy converting elements.

This kind of image reading device reduces to practice the above-mentioned image reading method, and in this case, by using the initializing means, repetitions of the sequential application of a driving voltage to the dummy photoelectric energy converting elements are carried out, so that the capacitance surge initially generated is sufficiently dissipated. Furthermore, since the driving voltage is applied repeatedly to a plurality of the same dummy photoelectric energy converting elements, the number of dummy photoelectric energy converting elements becomes comparatively small.

Moreover, it is possible to apply the image reading method of the present invention to an image reading method in which a driving pulse is applied to photodiodes with a set time period and the amounts of light which entered said photodiodes within said set time periods are read as electrical signals by time-integrating the currents flowing out from said photodiodes during the applications of said driving pulses, so that a dummy driving pulse is applied to dummy photodiodes made in common with the above-mentioned photodiode output line, which falls when the above-mentioned driving pulse rises and rises when said driving pulse falls and the time-integration is carried out until after the fall of the above-mentioned driving pulse. In addition, it is possible to apply the image reading method of the present invention to an image reading method in which a respective driving pulse is applied sequentially with a set time period to a plurality of photodiodes in a common output line, and the amounts of light which entered said photodiodes within said set time periods are read out as electric signals by time-integrating the currents flowing out from said photodiodes during the applications of said driving pulses, so that an auxiliary driving pulse is applied to the photodiodes to which the application of the above-mentioned driving pulse is finished which rises when the driving pulse applied to the corresponding next photodiode falls and which falls when the driving pulse applied to the corresponding second next photodiode rises, and the time-integration is carried out until after the fall of the above-mentioned driving pulse.

Furthermore, it is possible to apply the image reading device of the present invention to an image reading device provided with photodiodes, a driver circuit which applies a driving pulse with a set time period to said photodiodes and a signal processing circuit which time-integrates the electrical currents flowing out from said photodiodes during the applications of said driving pulse, which is constructed so that dummy photodiodes are set up in common with the above-mentioned photodiode output line and a dummy driver circuit is set up which applies a dummy driving pulse to said dummy photodiodes which falls when the above-mentioned driving pulse rises and rises when said driving pulse falls, and the above-mentioned signal processing circuit is time-integrated until after the fall of the above-mentioned driving pulse. In addition, it is possible to apply the image reading device of the present invention to an image reading device provided with a plurality of photodiodes in a common output line, a driver circuit which sequentially applies a respective driving pulse with a set time period to said photodiodes and a signal processing circuit which time-integrates the currents flowing out from said photodiodes during the applications of said driving pulse, which is constructed so that an auxiliary driver circuit is set up which applies an auxiliary driving pulse to the photodiodes to which the application of the above-mentioned driving pulse has finished, which rises at the time when the driving pulse applied to the corresponding next photodiode falls and falls at the time when the driving pulse applied to the corresponding second next photodiode rises, and the above-mentioned signal processing circuit is time-integrated until after the fall of the above-mentioned driving pulse.

According to this kind of image reading method or device thereof, a driving pulse is applied to photodiodes with a set time period using a driver circuit or the like, and a dummy driving pulse is applied to dummy photodiodes using a dummy driver circuit or the like. Since the dummy driving pulse falls at the time when the driving pulse rises and rises at the time when the driving pulse falls, the generated capacitance surge originating from the capacitance of the photodiode and the generated capacitance surge originating from the capacitance of the dummy photodiode have respective polarities opposite each other, so that they are almost completely canceled.

However, because these capacitances are different, the capacitance surges are not completely canceled and a small amount remains. That is to say, in the case when the photodiode capacitance is larger, the remaining component of the capacitance surge appears as positive noise at the time when the driving pulse rises, and it appears as negative noise when the driving pulse falls. Conversely, in the case when the capacitance of the dummy photodiode is larger, the remaining component of the capacitance surge appears as negative noise at the time when the driving pulse rises, and it appears as positive noise when the driving pulse falls. Not only do the remaining components of the capacitance surges have opposite respective polarities, but since the remaining components originate from differences in the capacitance between certain specific photodiodes and dummy photodiodes, their size is entirely the same. Hence, by using a signal processing circuit or the like, by time-integrating the electric current flowing out from the photodiode not only during the application of the driving pulse but also until after the fall of the driving pulse, these remaining components of the capacitance surge are completely canceled, and only the amount of light entering the photodiode during the set time period is read out as the electrical signal.

Furthermore, using a driver circuit or the like, driving pulses are applied respectively in sequence with a set time period to the plurality of photodiodes, and using an auxiliary driver circuit or the like, auxiliary driving pulses are applied to the photodiodes to which the application of the driving pulse is finished. Because this auxiliary driving pulse is applied so that it rises at the time when the driving pulse applied to the next photodiode falls and so that it falls at the time when the driving pulse applied to the second next photodiode rises, the capacitance surge generated when the driving pulse rises is canceled by the capacitance surge generated when the auxiliary driving pulse applied to the second previous photodiode falls, and the capacitance surge generated when the driving pulse falls is canceled by the capacitance surge generated when the auxiliary driving pulse applied to the immediately preceding photodiode rises.

In this way, the capacitance surge is almost completely canceled. However, because the capacitances of the three photodiodes are different, the capacitance surge is not completely canceled and a small amount remains. Not only do the remaining components have opposite respective polarities, but because the remaining components originate in the capacitance differences between certain specific photodiodes and immediately preceding or second preceding photodiodes, their sizes are almost the same. Hence, using the signal processing circuit or the like, by time-integrating the electric current flowing out from the photodiode not only during the application of the driving pulse but also until after the fall of the driving pulse, the remaining components of the capacitance surge are approximately completely canceled, and only the amount of light which entered the photodiode during the set time period is read out as the electrical signal.

Thus, by adding the above-mentioned constructions to the image reading apparatus and method of the present invention, the noise accompanying the driving voltage can be easily reduced.

In addition, the present invention can be applied to systems other than charge storage type systems in which a capacitance surge occurs easily, such as a photoconductive-type element using CdS–CdSe or the like in the photoelectric energy converting element, and within the scope of the present invention and without deviating from its spirit, various kinds of additional improvements, revisions and modifications are possible by the intelligence of one skilled in the art.

What is claimed is:

1. An image reading method in which a driving voltage is sequentially applied via a matrix driver to a plurality of photoelectric energy converting elements disposed in a one-dimensional array and the electrical signals of said photoelectric energy converting elements are read, wherein the drive side on which the driving voltage is applied to said photoelectric energy converting elements is divided every x elements into y blocks, comprising the steps of:

sequentially applying a first driving voltage to the units of x photoelectric energy converting elements in said blocks;

sequentially applying a second driving voltage to the photoelectric energy converting elements in the same relative positions in the respective blocks; and driving the appropriate photoelectric energy converting elements when said first driving voltage and said second driving voltage are applied simultaneously, wherein the first and second driving voltages are applied to the photoelectric energy converting elements via the matrix driver, the matrix driver including a plurality of resistors to form an adding circuit.

2. An image reading method in which a plurality of photoelectric energy converting elements disposed in a one-dimensional array is divided every m elements into n first blocks, a driving voltage is applied sequentially via a matrix driver to the units of m photoelectric energy converting elements in said first blocks and the electrical signals of said photoelectric energy converting elements are read, wherein the drive side on which the driving voltage is sequentially applied to said divided n first blocks is further divided every x first blocks into y second blocks, comprising the steps of:

sequentially applying a first driving voltage to the units of x first blocks in said second blocks;

sequentially applying a second driving voltage to the first blocks in the same relative positions in the respective second blocks; and driving the appropriate units of m photoelectric energy converting elements in the first blocks when said first driving voltage and said second driving voltage are applied simultaneously to the first blocks, wherein the first and second driving voltages are applied to the photoelectric energy converting elements via the matrix driver, the matrix driver including a plurality of resistors to form an adding circuit.

3. An image reading device in which a driving voltage is sequentially applied to a plurality of photoelectric energy converting elements disposed in a one-dimensional array and the electrical signals of said photoelectric energy converting elements are read, wherein the drive side on which the driving voltage is applied to the photoelectric energy converting elements is divided every x elements into y blocks, the image reading device comprising:

a first voltage application means for applying a first driving voltage in sequence to the units of x photoelectric energy converting elements in said blocks;

a second voltage application means for applying a second driving voltage in sequence to the photoelectric energy converting elements in the same relative positions in the respective blocks; and a matrix driver for applying the driving voltage to drive the appropriate photoelectric energy converting elements when said first driving voltage and said second driving voltage are applied simultaneously, wherein the matrix driver comprises a circuit for adding said first and second driving voltages, said adding circuit comprising resistors connected between said first and second voltage application means and said units of photoelectric energy converting elements.

4. An image reading device in which a plurality of photoelectric energy converting elements disposed in a one-dimensional array is divided every m elements into n first blocks, a driving voltage is applied sequentially to the units of m photoelectric energy converting elements in said first blocks and the electrical signals of said photoelectric energy converting elements are read, wherein the drive side on which the driving voltage is applied sequentially to said divided n first blocks is further divided every x first blocks into y second blocks, the image reading device comprising:

a first voltage application means for applying a first driving pulse sequentially to the units of x first blocks in said second blocks;

a second voltage application means for applying a second driving voltage sequentially to the first blocks in the same relative positions in the respective second blocks; and a matrix driver for applying the driving voltage to drive the appropriate units of m photoelectric energy converting elements in the first blocks when said first driving voltage and said second driving voltage are applied simultaneously to the first blocks, wherein the matrix driver comprises a circuit for adding said first and second driving voltages, said adding circuit comprising resistors connected between said first and second voltage application means and said units of photoelectric energy converting elements.

5. The image reading device recited in claim 3 or 4 wherein the matrix driver comprises a circuit for addition comprising resistors which is formed from constructing layers which form the photoelectric energy converting elements.

6. The image reading device recited in claim 5 wherein the photoelectric energy converting element comprises a photodiode and a blocking diode connected in series and having opposite respective polarities.

7. An image reading device in which a driving voltage is sequentially applied to a plurality of photoelectric energy converting elements disposed in a one-dimensional array and the electrical signals of said photoelectric energy converting elements are read, wherein the drive side on which the driving voltage is applied to the photoelectric energy converting elements is divided every x elements into y blocks, the image reading device comprising:

a first voltage application means for applying a first driving voltage in sequence to the units of x photoelectric energy converting elements in said blocks;

a second voltage application means for applying a second driving voltage in sequence to the photoelectric energy converting elements in the same relative positions in the respective blocks; and a matrix driver for applying the driving voltage to drive the appropriate photoelectric energy converting elements when said first driving voltage and said second driving voltage are applied simultaneously, wherein the matrix driver comprises a circuit for adding said first and second driving voltages, said adding circuit comprising AND circuit including diodes connected between said first and second voltage application means and said units of photoelectric energy converting elements.

8. An image reading device in which a plurality of photoelectric energy converting elements disposed in a one-dimensional array is divided every m elements into n first blocks, a driving voltage is applied sequentially to the units of m photoelectric energy converting elements in said first blocks and the electrical signals of said photoelectric energy converting elements are read, wherein the drive side on which the driving voltage is applied sequentially to said divided n first blocks is further divided every x first blocks into y second blocks, the image reading device comprising:

a first voltage application means for applying a first driving pulse sequentially to the units of x first blocks in said second blocks;

a second voltage application means for applying a second driving voltage sequentially to the first blocks in the same relative positions in the respective second blocks; and a matrix driver for applying the driving voltage to drive the appropriate units of m photoelectric energy converting elements in the first blocks when said first driving voltage and said second driving voltage are applied simultaneously to the first blocks, wherein the matrix driver comprises a circuit for adding said first and second driving voltages, said adding circuit comprising AND circuitry including diodes connected between said first and second voltage application means and said units of photoelectric energy converting means.

9. The image reading device recited in any one of claims 3, 4, 7 or 8 wherein the photoelectric energy converting element comprises a photodiode and a blocking diode connected in series and having opposite respective polarities.

10. An image reading method in which a driving voltage is sequentially applied via a matrix driver to a plurality of photoelectric energy converting elements disposed in a one-dimensional array and the electrical signals of said photoelectric energy converting elements are read, wherein the drive side on which the driving voltage is applied to said photoelectric energy converting elements is divided every x elements into y blocks, comprising the steps of:

sequentially applying a first driving voltage to the units of x photoelectric energy converting elements in said blocks;

sequentially applying a second driving voltage to the photoelectric energy converting elements in the same relative positions in the respective blocks; and driving the appropriate photoelectric energy converting elements when said first driving voltage and said second driving voltage are applied simultaneously, wherein the first and second driving voltages are applied to the photoelectric energy converting elements via the matrix driver, the matrix driver including a plurality of resistors to form AND circuit.

11. An image reading method in which a plurality of photoelectric energy converting elements disposed in a one-dimensional array is divided every m elements into n first blocks, a driving voltage is applied sequentially via a matrix driver to the units of m photoelectric energy converting elements in said first blocks and the electrical signals of said photoelectric energy converting elements are read, wherein the drive side on which the driving voltage is sequentially applied to said divided n first blocks is further divided every x first blocks into y second blocks, comprising the steps of:

sequentially applying a first driving voltage to the units of x first blocks in said second blocks;

sequentially applying a second driving voltage to the first blocks in the same relative positions in the respective second blocks; and driving the appropriate units of m photoelectric energy converting elements in the first blocks when said first driving voltage and said second driving voltage are applied simultaneously to the first blocks, wherein the first and second driving voltages are applied to the photoelectric energy converting elements via the matrix driver, the matrix driver including a plurality of resistors to form AND circuit.

* * * * *